(12) United States Patent
Sugihara et al.

(10) Patent No.: US 11,130,188 B2
(45) Date of Patent: Sep. 28, 2021

(54) JET SOLDER BATH AND JET SOLDERING DEVICE

(71) Applicant: Senju Metal Industry Co., Ltd., Tokyo (JP)

(72) Inventors: Takashi Sugihara, Tokyo (JP); Kaname Nagata, Tokyo (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 16/957,154

(22) PCT Filed: Dec. 10, 2018

(86) PCT No.: PCT/JP2018/045237
§ 371 (c)(1),
(2) Date: Jun. 23, 2020

(87) PCT Pub. No.: WO2019/131080
PCT Pub. Date: Jul. 4, 2019

(65) Prior Publication Data
US 2021/0245282 A1    Aug. 12, 2021

(30) Foreign Application Priority Data
Dec. 25, 2017    (JP) .............................. JP2017-248367

(51) Int. Cl.
*B23K 3/00*    (2006.01)
*B23K 1/00*    (2006.01)
(Continued)

(52) U.S. Cl.
CPC ............ *B23K 3/0653* (2013.01); *B23K 1/203* (2013.01); *B23K 3/08* (2013.01)

(58) Field of Classification Search
CPC .... B23K 3/0653; B23K 1/0016; B23K 1/085; B23K 3/0646
(Continued)

(56) References Cited

U.S. PATENT DOCUMENTS 5,208,605 A * 5/1993 Drake .................. B41J 2/14016
347/15
6,164,516 A    12/2000 Watanabe et al.
(Continued)

FOREIGN PATENT DOCUMENTS

| CN | 1636663 A | 7/2005 |
|---|---|---|
| CN | 101480113 A | 7/2009 |

(Continued)

*Primary Examiner* — Erin B Saad
(74) *Attorney, Agent, or Firm* — The Webb Law Firm

(57) ABSTRACT

A jet solder bath for performing soldering by jetting molten solder to bring the molten solder into contact with a substrate is provided with a primary jet nozzle that jets the molten solder by a first jet pump, as a first jet nozzle, and a secondary jet nozzle, as a second jet nozzle, which is arranged at a downstream side of the primary jet nozzle along a carrying direction of the substrate and jets the molten solder by a second jet pump. The primary jet nozzle includes a first nozzle body, and a first solder-flow-forming plate that is provided at an upper end of the first nozzle body and has a plurality of jet holes, and the secondary jet nozzle includes a second nozzle body and a second solder-flow-forming plate that is provided at an upper end of the second nozzle body and has a plurality of jet holes.

12 Claims, 11 Drawing Sheets

(51) Int. Cl.
*B23K 3/06* (2006.01)
*B23K 3/08* (2006.01)
*B23K 1/20* (2006.01)

(58) Field of Classification Search
USPC .................................................. 228/37, 260
See application file for complete search history.

(56) References Cited

U.S. PATENT DOCUMENTS

| | | | |
|---|---|---|---|
| 6,805,282 B2 | 10/2004 | Kawashima et al. | |
| 7,416,103 B2 | 8/2008 | Kaneko | |
| 7,905,382 B2 | 3/2011 | Zen et al. | |
| 8,162,460 B2* | 4/2012 | Amma | B41J 2/17513 347/87 |
| 9,370,838 B2* | 6/2016 | Hueste | B23K 3/0676 |
| 10,780,516 B2* | 9/2020 | Dautenhahn | B23K 3/0653 |
| 2012/0212540 A1* | 8/2012 | Dietl | B41J 2/14201 347/29 |
| 2014/0209661 A1 | 7/2014 | Hsieh | |
| 2015/0273847 A1* | 10/2015 | Mizuno | B41J 2/1752 347/93 |

FOREIGN PATENT DOCUMENTS

| | | |
|---|---|---|
| CN | 107398615 A | 11/2017 |
| EP | 1259101 A1 | 11/2002 |
| EP | 1600237 A1 | 11/2005 |
| JP | S6380070 U | 5/1988 |
| JP | H1266792 A | 10/1989 |
| JP | H371140 U | 7/1991 |
| JP | H489176 A | 3/1992 |
| JP | H513661 U | 2/1993 |
| JP | H6350245 A | 12/1994 |
| JP | H7202409 A | 8/1995 |
| JP | 2004356161 A | 12/2004 |
| JP | 2005117845 A | 7/2005 |
| JP | 2005177845 A | 7/2005 |
| JP | 4410490 B2 | 2/2010 |
| JP | 4729453 B2 | 7/2011 |

* cited by examiner

PRIOR ART

JET SOLDER BATH AND JET SOLDERING DEVICE

CROSS-REFERENCE TO RELATED APPLICATIONS

This application is the United States national phase of International Application No. PCT/JP2018/045237 filed Dec. 10, 2018, and claims priority to Japanese Patent Application No. 2017-248367 filed Dec. 25, 2017, the disclosures of which are hereby incorporated by reference in their entirety.

TECHNICAL FIELD

The present invention relates to a jet solder bath including a first jet nozzle that jets molten solder by a first pump and a second jet nozzle that jets the molten solder by a second pump in order to solder electronic component(s) to a substrate, and to a jet soldering device provided with the jet solder bath.

BACKGROUND ART

Generally, a jet type soldering device is used for soldering a substrate. The jet soldering device is provided with soldering process devices such as a preheater, a jet solder bath and a cooler. In the jet solder bath, a primary jet nozzle and a secondary jet nozzle, which jet, upward, molten solder pumped by individually provided pumps, are arranged side by side along a substrate-carrying direction. In addition, a soldering device is provided in which a fluxer for applying flux to a substrate is arranged in a stage preceding the preheater.

The wave jetted by the primary jet nozzle (referred to also as first jet nozzle) that jets molten solder by a first pump (referred to also as first jet pump) is rough, and has an action of allowing the molten solder to well penetrate into a through hole of the substrate, a sharp corner of a chip component, and the like. On the other hand, the wave jetted by the secondary jet nozzle that jets molten solder by a second pump (referred to also as second jet pump) is gentle, and has an action of re-melting a solder bridge and/or a solder projection if they are generated by soldering with the rough wave from the primary jet nozzle, to correct them into a good soldered portion. In addition, in the case where the wave generated from the primary jet nozzle is insufficient to wet the molten solder and allow it to rise in the through hole, around the corner or the like, the secondary jet nozzle has also played a role of sufficiently wetting the molten solder and allowing it to rise.

In the soldering by a jet solder bath, it is preferable that molten solder S can be solidified in a state where it has sufficiently spread from below to above in a through hole H formed in a substrate 5, as shown in FIG. 11A. However, if it takes a lot of time for the substrate to reach the secondary jet nozzle after soldering by the primary jet nozzle, the molten solder attached to the substrate by the primary jet nozzle is likely to be cooled and solidified, and a so-called "unsoldered" state is likely to occur such that the molten solder S having insufficiently been wetted to rise in the through hole H formed in the substrate 5 solidifies, as shown in FIG. 11B. In such an unsoldered state, the adhesive strength between a lead terminal L of an electronic component and the substrate 5 becomes weak, and, besides, solder cannot be added into the through hole later.

In order to solve such a problem, jet soldering devices have been proposed in each of which the moving time necessary for a substrate to move from a primary jet nozzle to a secondary jet nozzle is reduced by shortening the distance between the primary jet nozzle and the secondary jet nozzle or by integrating the primary jet nozzle with the secondary jet nozzle (for example, see Patent Documents 1 and 2).

PATENT DOCUMENTS

Patent Document 1: Japanese Patent No. 4410490
Patent Document 2: Japanese Patent No. 4729453
Patent Document 3: Japanese Patent Application Publication No. H07-202409

SUMMARY

However, especially in the past primary and secondary jet nozzles, when bonding, to a substrate, an electronic component requiring a high heat capacity, such as an electrolytic capacitor, the heat energy has been taken by the component in the through hole. Therefore, there has been a problem that, in the case where the wave generated from the primary jet nozzle is insufficient to wet the molten solder and allow it to rise in the through hole, even if the primary and the secondary jet nozzles are made close to each other or integrated with each other, the gentle wave from the secondary jet nozzle alone fails to sufficiently wet the molten solder and allow it in the through hole, so that an unsoldered state may occur. Further, in the flow soldering device of Patent Document 3, molten solder is jetted from a plurality of jet nozzles by a rotation of one common pump, and thus it has been necessary to provide therein an adjustment valve for adjusting the amount of jet flow of the molten solder from each nozzle.

The unsoldered state in the through hole cannot be visually confirmed. Besides, no problem occurs even when a continuity test is conducted after soldering. Therefore, it may be difficult to determine whether an unsoldered state has occurred or good soldering has been attained.

In order to sufficiently wet the molten solder from the primary jet nozzle and allow it to rise, it has been difficult to set the jet height of the molten solder on the upstream side and the downstream side, respectively, of a jet port in accordance with a substrate-carrying direction using the jet pump that drives the primary jet nozzle, only by increasing a width of the primary jet nozzle along the substrate-carrying direction, or increasing of the width of the primary jet nozzle followed by provision of a wall in the primary jet nozzle. In addition, if two primary jet nozzles are arranged side by side, the positions of the jet ports of the primary jet nozzles are separated from each other, so that the molten solder attached to the substrate has been problematically cooled and solidified while the substrate is being carried between the primary jet nozzles, thereby causing an unsoldered state.

Therefore, the present invention has solved such problems, and has an object to wet the molten solder and allow it to rise in a through hole of a substrate even when an electronic component requiring a high heat capacity is soldered to the substrate and to suppress an unsoldered state.

The technical means of the present invention adopted to solve the above-described problems are as follows.

(1) A jet solder bath for performing soldering by jetting molten solder to bring the molten solder into contact with a substrate, the jet solder bath including a first jet nozzle that jets the molten solder by a first jet pump, and a second jet nozzle that is arranged at a downstream side of the first jet nozzle along a substrate-carrying direction and jets the molten solder by a second jet pump, wherein the first jet nozzle includes a first nozzle body, and a first solder-flow-forming plate that is provided at an upper end of the first nozzle body and has a plurality of jet holes, wherein the second jet nozzle includes a second nozzle body, and a second solder-flow-forming plate that is provided at an upper end of the second nozzle body and has a plurality of jet holes, and wherein a guide plate having a plurality of holes is provided on at least any of an upstream side of the first nozzle body in the substrate-carrying direction, a downstream side of the second nozzle body, and an interval between the first nozzle body and the second nozzle body.

(2) The jet solder bath according to the item (1), wherein the plurality of jet holes of the first solder-flow-forming plate and the second solder-flow-forming plate, respectively, are arranged in a staggered manner, and wherein, when a first group of holes forming a row along a direction orthogonal to the substrate-carrying direction and a second group of holes forming a row along the direction orthogonal to the substrate-carrying direction and being arranged at a downstream side of the first group of holes are defined as one hole group, at least two hole groups are arranged along the substrate-carrying direction.

(3) The jet solder bath according to the item (1) or (2), wherein the guide plate is provided so as to be inclined with respect to a dropping direction of the molten solder which is jetted upward from below and dropped downward from above.

(4) The jet solder bath according to any one of the items (1) to (3), wherein each of the plurality of holes provided in the guide plate have a diameter larger than that of each of the plurality of jet holes provided in the first solder-flow-forming plate.

(5) The jet solder bath according to any one of the items (1) to (4), further including a bridge member arranged between the first jet nozzle and the second jet nozzle.

(6) The jet solder bath according to any one of the items (1) to (5), further including a third jet nozzle that is arranged at a downstream side of the second jet nozzle in the substrate-carrying direction and jets the molten solder by a third jet pump, wherein the first jet nozzle and the second jet nozzle jet rough waves of the molten solder, and wherein the third jet nozzle jets a gentle wave of the molten solder.

(7) A jet soldering device including a preheater that preheats a substrate, the jet solder bath according to any one of Claims 1 to 6, a cooler that cools the substrate soldered in the jet solder bath, and a control unit that controls operations of the preheater, the jet solder bath and the cooler.

(8) A jet soldering device including a fluxer that applies flux to a substrate, a preheater that preheats the substrate applied with the flux, the jet solder bath according to any one of (1) to (6), a cooler that cools the substrate soldered in the jet solder bath, and a control unit that controls operations of the fluxer, the preheater, the jet solder bath and the cooler.

According to the present invention, the molten solder is jetted as rough waves from both the first jet nozzle and the second jet nozzle, so that the molten solder jetted from the first jet nozzle is wetted and rise in the through hole of the substrate, and then, the molten solder jetted from the second jet nozzle also is wetted and rise in the through hole of the substrate. Therefore, even when an electronic component requiring a high heat capacity is soldered to the substrate, the molten solder is sufficiently wetted and rise in the through hole of the substrate, thereby being able to suppress an unsoldered state.

DETAILED DESCRIPTION

The following will describe embodiments of a jet solder bath and a jet soldering device as embodiments according to the present invention with reference to the drawings. Hereinafter, the term "upstream side" refers to a side on which a substrate is carried in the jet soldering device along a substrate-carrying direction indicated by an outline arrow in each figure, and the term "downstream side" refers to a side on which the substrate is carried out of jet soldering device. In addition, molten solder is assumed to be jetted upward from below. In this example, the present invention will be described using embodiments relating to a soldering process device including a fluxer, a preheater unit, a jet solder bath, and a cooler, but is, of course, not limited to the example. The case where the substrate is carried at a predetermined angle, for example, at an elevation angle inclined at about 5° will be illustrated.

[Example of Overall Configuration of Jet Soldering Device 1]

Figure 1:
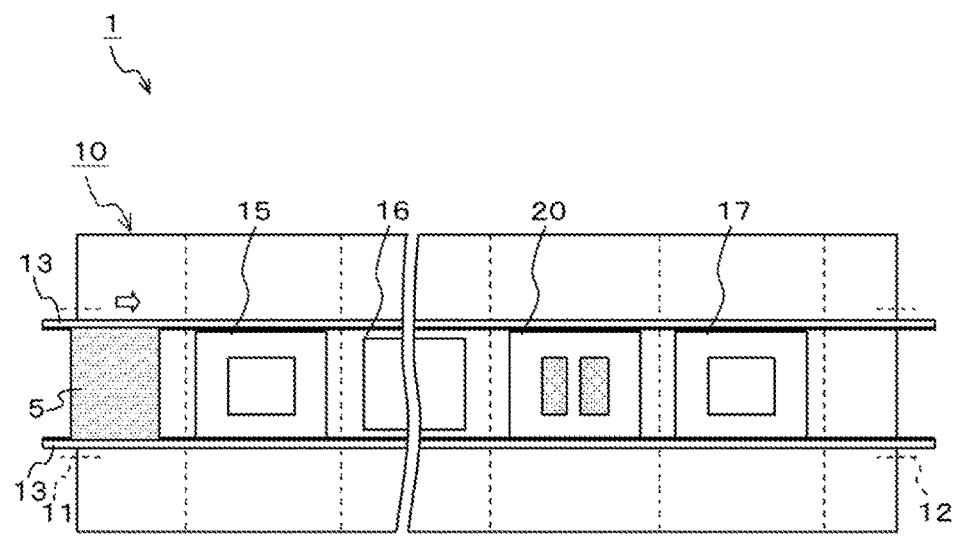
FIG. 1 is a schematic plan view showing a configuration example of a jet soldering device 1 according to the present invention.

A jet soldering device 1 shown in FIG. 1 is, for example, a device that solders a substrate 5 on which an electronic component is placed by jetting molten solder thereto, and includes a body 10 and carrying rails 13 for carrying the substrate 5 along a direction indicated by an outline arrow in the figure. The body 10 is a housing, and has, on its sides, a carry-in port 11 for carrying the substrate 5 therein and a carry-out port 12 for carrying the substrate 5 out thereof. The side on which the carry-in port 11 is located is the upstream side as described above.

Figure 2:
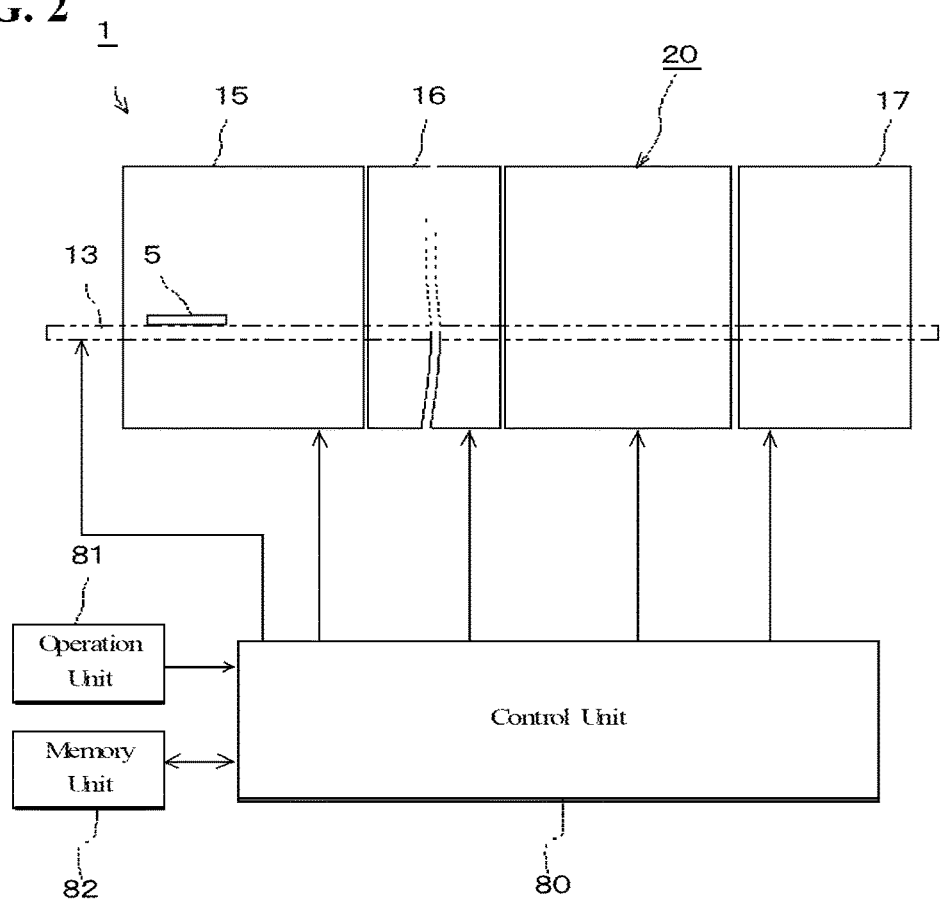
FIG. 2 is a block diagram showing a control system of the jet soldering device 1.

The body 10 includes, therein, a fluxer 15 for applying flux to the substrate 5, a preheater unit 16 for preheating the substrate 5 applied with the flux, a jet solder bath 20 for jetting molten solder to bring it into contact with the substrate 5, and a cooler 17 for cooling the soldered substrate 5, which are provided in this order from the upstream side along the carrying rails 13. When the carrying rails 13 discharge the substrate 5 from the carry-out port 12, the soldering process by means of the jet soldering device 1 is completed. Further, the jet soldering device 1 includes a control unit 80, as shown in FIG. 2, for controlling the operation of each portion.

The fluxer 15 applies flux to the carried substrate 5. A solvent, an activator and the like are used for the flux. The fluxer 15 may be provided with a plurality of applying devices. In that case, they may be used properly depending on the types of solder, the substrate 5 and the flux. The fluxer 15 may be omitted.

The preheater unit 16 heats the substrate 5 to uniformly increase the temperature of the substrate 5 up to a predetermined temperature. When the substrate 5 is heated in this manner, the solder is likely to be attached to any predetermined sites of the substrate 5. As the preheater unit 16, for example, a halogen heater is used. Further, a gas (hot air) heated by the heater may be blown onto the substrate 5 by a fan to heat the substrate 5, or a far-infrared panel heater or the like may be used.

The jet solder bath 20 jets molten solder S, which has been pumped through a duct (not shown) by a pump (not shown), onto the substrate 5 to form solder at any predetermined sites on the substrate 5. The jet solder bath 20 heats the molten solder to a temperature of about 250° C. by a heater (not shown). The configuration of the jet solder bath 20 will be described later in detail.

The cooler 17 has a cooling fan (not shown), and cools the substrate 5 that has been soldered in the jet solder bath 20. Although, in the present example, the cooling fan is controlled to be ON or OFF only, the cooling time may be arbitrarily set by an operator according to the product. Alternatively, the temperature may be controlled using a means such as a chiller so that the substrate 5 is cooled to a predetermined temperature. Even in this case, the operator can arbitrarily set the cooling temperature.

As shown in FIG. 2, the control unit 80 is connected to the carrying rails 13, the fluxer 15, the preheater unit 16, the jet solder bath 20, the cooler 17, the operation unit 81, and the memory unit 82. As the operation unit 81, a liquid crystal display panel, a numeric keypad or the like is used. When the operator operates the operation unit 81, the control unit 80 controls the carrying speed of the substrate on the carrying rails 13, the timing of carrying the substrate 5, the temperature of the flux the fluxer 15 has, the amount of the flux to be applied, the temperature of the preheater unit 16, the temperature, jet flow rate and jet speed of the molten solder S in the jet solder bath 20, the ON/OFF of the cooling fan (not shown) the cooler 17 has, and the like. The memory unit 82 stores information input by the operation unit 81, instructions from the control unit 80, the operating time of the jet soldering device 1, and the like.

The following will describe the jet solder bath in each embodiment. Each jet solder bath can be provided in the jet soldering device 1 described above.

[Configuration Example of Jet Solder Bath 20A of First Embodiment]

Figure 3:
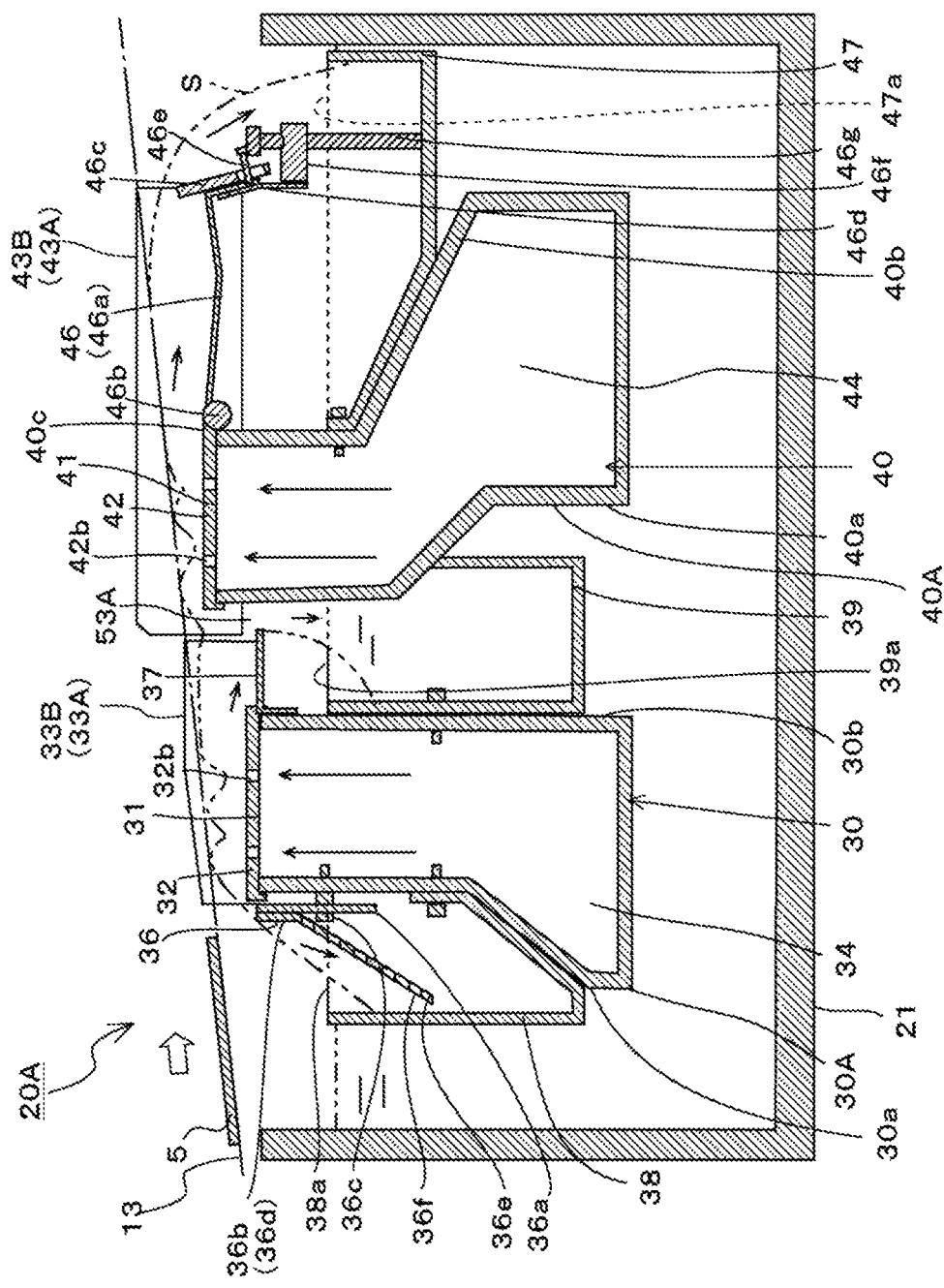
FIG. 3 is a schematic cross-sectional view showing a configuration example of a jet solder bath 20A according to a first embodiment of the present invention.

As shown in FIGS. 3 and 4, a jet solder bath 20A is an example of the jet solder bath 20, and includes a solder bath body 21 which is a housing containing the molten solder S, and a primary jet nozzle 30 as a first jet nozzle provided above in the solder bath body 21 and a secondary jet nozzle 40 as a second jet nozzle arranged at a downstream side of the primary jet nozzle 30 are provided in the solder bath body 21. The solder bath body 21 accommodates the molten solder S obtained by heating solder by a heater (not shown), over a predetermined depth. A first jet pump (not shown) is installed in a lower portion of the primary jet nozzle 30 via a duct (not shown), and a second jet pump (not shown) is installed in a lower portion of the secondary jet nozzle 40 via a duct (not shown).

The primary jet nozzle 30 includes a nozzle body 30A that is open at the top and bottom, and jets the molten solder S from a jet port 31 that is an opening at an upper end of the nozzle body 30A. The primary jet nozzle 30 includes a solder-flow-forming plate 32 as a first solder-flow-forming plate for jetting the molten solder S from the jet port 31.

The jet port 31 protrudes upward from a liquid level of the molten solder S. The jet port 31 is provided with side plates 33A and 33B, and the side plates 33A and 33B protrude upward from the molten solder S to be jetted from the jet port 31, so that the molten solder S jetted from the jet port 31 does not flow down in a direction orthogonal to the carrying direction of the substrate 5.

The nozzle body 30A has therein a hollow portion 34 having a rectangular bottom surface. A guide plate 36 is provided on an upper side, on the upstream side, of an upstream wall 30a of the nozzle body 30A, and a bridge member 37 is provided between the primary jet nozzle 30 and the secondary jet nozzle 40. The nozzle body 30A is also provided with a solder receiving portion 38 that receives the molten solder S that has been jetted from the jet port 31 and has dropped to the upstream side of the nozzle body 30A, and a solder receiving portion 39 that receives the molten solder S that has been jetted from the jet port 31 and has dropped to the downstream side of the nozzle body 30A.

The solder-flow-forming plate 32 is a flat plate having substantially the same shape as that of the jet port 31, and is provided at the upper end of the nozzle body 30A so that it is in parallel with the liquid level of the molten solder S. As shown in FIG. 4B, a plurality of cylindrical jet holes 32b are formed in the solder-flow-forming plate 32, and the molten solder S is jetted from the jet holes 32b vigorously and stably at a desired height. Among the jet holes 32b, when a first group of holes 32b1 forming a row along the direction orthogonal to the carrying direction of the substrate 5 indicated by an outline arrow in the figure and a second group of holes 32b2 forming a row along the direction orthogonal to the carrying direction of the substrate 5 and being arranged at the downstream side of the first group of holes 32b1 are defined as one hole group 32c1, two hole groups 32cl are arranged along the carrying direction of the substrate 5. The holes in the first group of holes 32b1 are respectively arranged as to be shifted to each other by at a predetermined pitch along the carrying direction of the substrate 5. The second group of holes 32b2 is shifted from the first group of holes 32b1 by ½ pitch along the direction in which the substrate 5 is carried. In this embodiment, each of the jet holes 32b has an opening diameter of about 5 mm.

The guide plate 36 has a mounting portion 36a to be provided on the nozzle body 30A, and a guide portion 36b to be joined to the mounting portion 36a on a side opposite to the nozzle body 30A. The mounting portion 36a is mounted to the wall 30a with a screw 36c. The guide portion 36b has a plate portion 36d joined to the mounting portion 36a, and a guide portion 36e bent below the plate portion 36d in a direction away from the mounting portion 36a. The guide portion 36e is provided so as to be inclined with the upstream side thereof and the downstream side thereof being downward and upward, in a dropping direction of the molten solder S which has been jetted upward from below and has dropped downward from above. A plurality of holes 36f is provided in a staggered manner in the guide portion 36e.

The bridge member 37 is joined to an upper side of a downstream wall 30b of the nozzle body 30A, and extends toward an upstream wall 40a of the secondary jet nozzle 40. An upper surface of the bridge member 37 is provided so that it is in parallel with the solder-flow-forming plate 32, and guides the flow of the molten solder S that has been jetted from the jet port 31 and has not been attached to the substrate 5 to the downstream side. The length from an upstream end to a downstream end of the bridge member 37 is shorter than the distance between the primary jet nozzle 30 and the secondary jet nozzle 40, and a gap 53A is provided between the downstream end of the bridge member 37 and the upstream wall 40a of the secondary jet nozzle 40.

The width of the bridge member 37 orthogonal to the carrying direction of the substrate 5 is the same as the width of the jet port 31 orthogonal to the carrying direction of the substrate 5. The side plates 33A and 33B also extend to the sides of the bridge member 37, and thus regulate the molten solder S guided on the bridge member 37 in such a manner that the molten solder S does not flow down in the direction orthogonal to the carrying direction of the substrate 5, and smoothens the surface of the flow of the molten solder S on the bridge member 37.

The gap 53A forms a hole near the secondary jet nozzle 40 along the direction orthogonal to the carrying direction of the substrate 5. To prevent the molten solder S that has been jetted from the primary jet nozzle 30 and the molten solder S that has been jetted from the secondary jet nozzle 40 from interfering with each other, and to prevent the molten solder S that has been jetted from the primary jet nozzle 30 and attached to the substrate 5 from cooling and solidifying, the length of the gap 53A from the upstream end thereof to the downstream end hereof is preferably, for example, 5 mm or more and 7 mm or less. Therefore, the length of the bridge member 37 along the flow direction of the molten solder S guided on the bridge member 37 is preferably shorter by 5 mm or more and 7 mm or less than the distance between the downstream wall 30b of the primary jet nozzle 30 and the wall 40a of the secondary jet nozzle 40. However, it can be changed depending on various factors such as the size of the substrate, the carrying speed thereof, the type of solder used for performing the soldering process, and the setting of the melting temperature of the molten solder.

The solder receiving portion 38 has a container shape having an open upper end 38a and an opening 38b on its one side, and is screwed to the wall 30a. The upper end 38a of the solder receiving portion 38 protrudes upward from the liquid level of the molten solder S. The width of the solder receiving portion 38 orthogonal to the carrying direction of the substrate 5 is the same as or larger than the width of the jet port 31, and the guide portion 36e of the guide plate 36 is accommodated in the solder receiving portion 38.

The solder receiving portion 39 has a container shape having an open upper end 39a and an opening 39b on its one side, and is screwed to the wall 30b. The upper end 39a of the solder receiving portion 39 protrudes upward from the liquid level of the molten solder S. The bottom of the solder receiving portion 39 is located below the gap 53A.

The secondary jet nozzle 40 includes a nozzle body 40A that is open at the top and bottom, and jets the molten solder S from a jet port 41 that is an opening at an upper end of the nozzle body 40A. The secondary jet nozzle 40 includes a solder-flow-forming plate 42 as a second solder-flow-forming plate for jetting the molten solder S from the jet port 41.

At an upper end 40c of a downstream wall 40b of the nozzle body 40A, a downstream-forming portion 46 (rear former) for shaping the molten solder flow to change the jet flow width is provided. The nozzle body 40A has a hollow portion 44 having a rectangular bottom surface, and the upper side of the hollow portion 44 is closer to the primary jet nozzle 30 than the lower side thereof. The secondary jet nozzle 40 is also provided with a solder receiving portion 47 for receiving the molten solder S that has been jetted from the jet port 41 and has dropped to the downstream side of the nozzle body 40A.

The jet port 41 protrudes upward from the liquid level of the molten solder S. The jet port 41 is provided with side plates 43A and 43B, and the side plates 43A and 43B protrude upward from the molten solder S to be jetted from the jet port 41, so that the molten solder S jetted from the jet port 41 does not flow down in the direction orthogonal to the carrying direction of the substrate 5. The side plates 43A and 43B also each extend to the side of the downstream-forming portion 46, and thus regulate the molten solder S guided on the downstream-forming portion 46 in such a manner that the molten solder S does not flow down in the direction orthogonal to the carrying direction of the substrate 5, and smoothens the surface of the flow of the molten solder S on the downstream-forming portion 46.

In the present embodiment, the same member as that of the solder-flow-forming plate 32 is used for the solder-flow-forming plate 42, and the solder-flow-forming plate 42 is a flat plate having substantially the same shape as that of the jet port 41, and is provided at the upper end of the nozzle body 40A so that it is in parallel with the liquid level of the molten solder S. As shown in FIG. 4B, a plurality of cylindrical jet holes 42b are formed in the solder-flow-forming plate 42, and the molten solder S is jetted from the jet holes 42b vigorously and stably at a desired height. Among the jet holes 42b, when a first group of holes 42b1 forming a row along the direction orthogonal to the carrying direction of the substrate 5 and a second group of holes 42b2 forming a row along the direction orthogonal to the carrying direction of the substrate 5 and being arranged at the downstream side of the first group of holes 42b1 are defined as one hole group 42c1, two hole groups 42cl are arranged along the carrying direction of the substrate 5. The holes in the first group of holes 42b1 are respectively arranged so as to be shifted to each other by at a predetermined pitch along the carrying direction of the substrate 5. The second group of holes 42b2 is shifted from the first group of holes 42b1 by ½ pitch along the direction in which the substrate 5 is carried.

The downstream-forming portion 46 includes a downstream forming plate 46a that forms the molten solder S that is jetted from the jet port 41 and flows to the downstream side, a shaft 46b for rotating the downstream forming plate 46a with respect to the nozzle body 40A, a solder-flow-changing plate 46c attached to a downstream end of the downstream forming plate 46a, a support plate 46d provided at a position sandwiching the downstream forming plate 46a with respect to the solder-flow-changing plate 46c, screws 46e for fixing the solder-flow-changing plate 46c, the downstream forming plate 46a and the support plate 46d in this order, a protrusion portion 46f protruding from the support plate 46d, and a bolt 46g inserted into a screw hole formed in the protrusion portion 46f.

Figure 5:
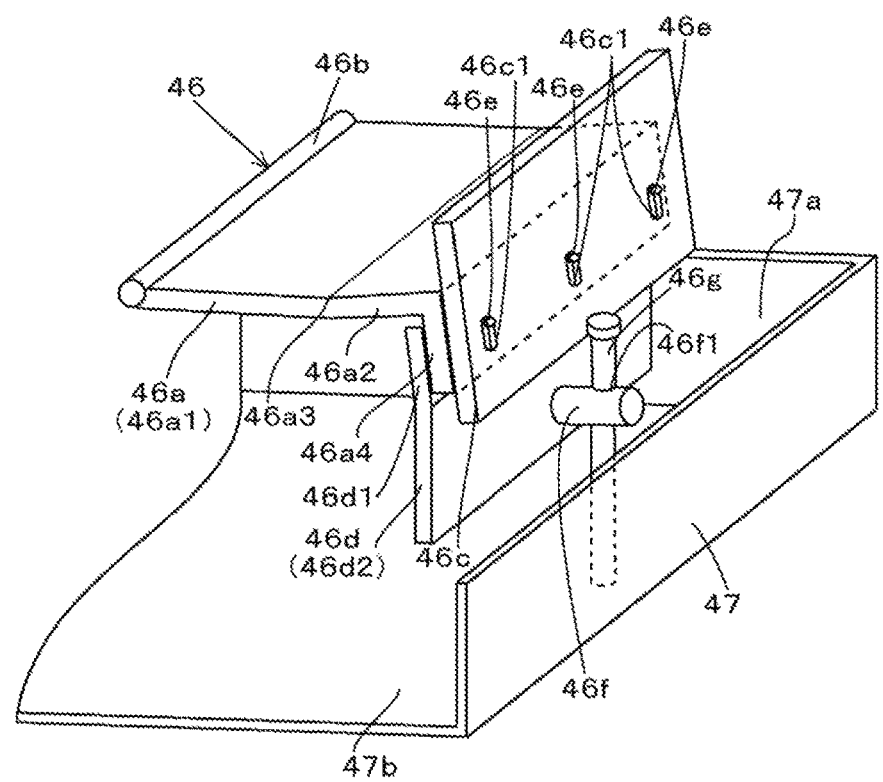
FIG. 5 is a perspective view showing a configuration example of a downstream-forming portion 46.

As shown in FIG. 5, the downstream forming plate 46a has a guiding portion 46a1 that guides the flow of the molten solder S to the downstream side along the carrying direction of the substrate 5, a guiding portion 46a2 that is bent upward from a bent portion 46a3 which is a downstream end of the guiding portion 46a1, and a mounting portion 46a4 that is bent downward at a downstream end of the guiding portion 46a2. The guiding portion 46a1 extends from the shaft 46b such that the downstream side is located below.

Referring back to FIG. 3, the shaft 46b is provided at an upstream end of the guiding portion 46a1 and extends orthogonally to the carrying direction of the substrate 5. The shaft 46b is rotatably mounted to the upper end 40c of the downstream wall 40b of the nozzle body 40A.

As shown in FIG. 5, the solder-flow-changing plate 46c is provided with vertically long holes 46c1. The solder-flow-changing plate 46c is fixed to the downstream forming plate 46a and the support plate 46d, by the screws 46e, via the long holes 46c1, screw holes provided in the mounting portion 46a4, and screw holes provided in the support plate 46d. Therefore, the height of the solder-flow-changing plate 46c with respect to the downstream forming plate 46a can be vertically changed by changing the height at which the screws 46e are screwed with respect to the long holes 46c1.

The support plate 46d has a mounting portion 46d1 having the screw holes into which the screws 46e are screwed, and a support portion 46d2 bent from the mounting portion 46d1. The protrusion portion 46f protrudes in a direction opposite to the nozzle body 40A so as to be extended orthogonally from the support portion 46d2. The protrusion portion 46f is provided with a screw hole 46f1 that penetrates the protrusion portion 46f orthogonally to a direction protruding from the support portion 46d2.

The shaft of the bolt 46g extends downward and is screwed into the screw hole 46f1. A tip of the bolt 46g contacts a bottom surface of the solder receiving portion 47. When the bolt 46g is rotated in a direction in which a head of the bolt 46g approaches or moves away from the protrusion portion 46f, the height of the bolt 46g with respect to the solder receiving portion 47 is unchanged, and the protrusion portion 46f moves up or down with respect to the bolt 46g, so that the downstream forming plate 46a, the solder-flow-changing plate 46c and the support plate 46d rotate together with the protrusion portion 46f around the shaft 46b as a fulcrum.

The solder receiving portion 47 has a container shape having an open upper end 47a and an opening 47b on its one side, and is screwed to the wall 40b of the nozzle body 40A. The upper end 47a of the solder receiving portion 47 protrudes upward from the liquid level of the molten solder S. The width of the solder receiving portion 47 orthogonal to the carrying direction of the substrate 5 is the same as or larger than the width of the jet port 41. The bottom surface of the solder receiving portion 47 supports the tip of the bolt 46g.

[Operation Example of Jet Soldering Device 1 and Jet Solder Bath 20A]

Next, an operation example will be described. It is assumed that the operator performs various settings using the operation unit 81 (not shown) so that each portion is operated by the control unit 80.

As shown in FIG. 1, when the operator places the substrate 5 on the carrying rails 13, the carrying rails 13 carry the substrate 5 in the direction indicated by the outline arrow in the figure, and the substrate 5 is carried from the carry-in port 11 into the body 10. When the substrate 5 reaches the fluxer 15, the fluxer 15 applies flux to a predetermined site of the substrate 5.

The carrying rails 13 carry the substrate 5 applied with the flux by the fluxer 15 to the preheater unit 16. The preheater unit 16 heats the substrate 5 to a predetermined temperature.

The carrying rails 13 carry the substrate 5 heated to the predetermined temperature by the preheater unit 16 to the jet solder bath 20A. The jet solder bath 20A performs soldering of the substrate 5 at a predetermined site. A jet pump (not shown) is driven so that the molten solder S jets from the primary jet nozzle 30 and the secondary jet nozzle 40.

By driving the first jet pump (not shown) connected to the primary jet nozzle 30, the molten solder S enters the hollow portion 34 via the duct (not shown) as indicated by black arrows in FIG. 3, rises in the nozzle body 30A, and jets from the jet holes 32b of the solder-flow-forming plate 32 provided on the jet port 31. The molten solder S that has been jetted from the jet holes 31b comes into contact with and is attached to the substrate 5 carried by the carrying rails 13. The molten solder S jetted from the primary jet nozzle 30 forms a rough wave, and penetrates into a site where the solder does not easily enter, such as a through hole formed in the substrate 5 or a corner of an electronic component.

The molten solder S that has been jetted from the jet holes 32b but has not been attached to the substrate 5 flows down from the upstream side of the nozzle body 30A and the gap 53A. The molten solder S having flowed downward from the upstream side of the nozzle body 30A and hit the guide plate 36 drops into the solder receiving portion 38 along the inclination of the guide portion 36e or through the holes 36f. The molten solder S having dropped into the solder receiving portion 38 returns to the liquid level of the molten solder S stored in the solder bath body 21 from the opening 38b.

A part of the molten solder S that has been jetted from the jet hole 32b is cooled to form a solder ball, and may drop vigorously. The solder ball that has dropped vigorously bounces off at the liquid level of the molten solder S or the like and is attached to the substrate 5 to cause a defective product, or enters between terminals provided on the substrate 5 to cause a solder bridge. The solder bridges interfere with normal functioning of an electronic device incorporating the substrate. However, the provision of the guide plate 36 allows the molten solder S that has been jetted from the jet holes 32*b* to smoothly drop into the solder receiving portion 38 by virtue of the guide portion 36*e* and the holes 36*f*, thereby suppressing the generation of solder balls.

The molten solder S that has not attached to the substrate 5 and has moved to the downstream side of the nozzle body 30A is guided on the bridge member 37, and drops into the solder receiving portion 39 from the gap 53A at the downstream end of the bridge member 37. The molten solder S having dropped into the solder receiving portion 39 returns to the liquid level of the molten solder S stored in the solder bath body 21 from the opening 39*b*.

Since there is nothing opposes the flow of the molten solder S on the bridge member 37, the molten solder S flowing on the bridge member 37 can form a flat wave. Therefore, a decrease in the temperature of the substrate 5 passing over the bridge member 37 can be suppressed, and thus the molten solder S attached by the primary jet nozzle 30 does not cool or solidify. Therefore, the molten solder S can be further wetted and rise in the through hole formed in the substrate 5 and the like through the subsequent secondary jet nozzle 40.

When the second jet pump (not shown) connected to the secondary jet nozzle 40 is driven, the molten solder S enters the hollow portion 44 through the duct (not shown), rises in the secondary jet nozzle 40, and jets from the jet holes 42*b* formed in the solder-flow-forming plate 42 provided on the jet port 41. The molten solder S that has been jetted from the jet holes 42*b* comes into contact with, and is attached to the substrate 5 carried by the carrying rails 13 to be used for soldering.

In the molten solder S jetted from the jet holes 42*b*, the molten solder S having flowed to the upstream side of the jet port 41 flows down from the gap 53A, is received by the solder receiving portion 39, and then returns to the liquid level of the molten solder S stored in the solder bath body 21 from the opening 39*b*.

In the molten solder S jetted from the jet holes 42*b*, the molten solder S having flowed to the downstream side of the jet port 41 passes over the downstream-forming portion 46, flows down into the solder receiving portion 47 from the downstream side of the solder-flow-changing plate 46*c*, and then returns to the liquid level of the molten solder S stored in the solder bath body 21 from the opening 47*b*.

As shown in FIG. 1, the carrying rails 13 carry the soldered substrate 5 to the cooler 17. The cooling fan (not shown) of the cooler 17 cools the soldered substrate 5 for a predetermined time. After cooling of the substrate 5, when the carrying rails 13 discharge the substrate 5 from the carry-out port 12, the soldering process by means of the jet soldering device 1 is completed.

Figure 6A:
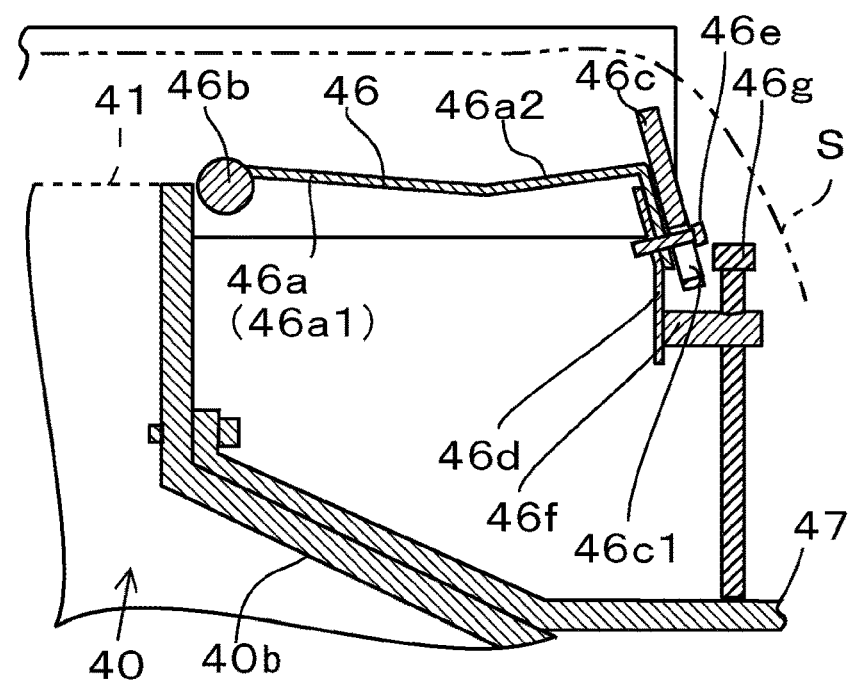
FIG. 6A is a cross-sectional view showing an operation example of the downstream-forming portion 46.

The operation of the downstream-forming portion 46 will now be described. FIG. 6A shows a state where the screws 46*e* are screwed at an uppermost position of each of the long holes 46*c*1 so that the solder-flow-changing plate 46*c* is mounted to the downstream forming plate 46*a* at the lowest position. In this state, the molten solder S that has been jetted from the jet port 41 toward the carrying rails 13 located above and flowed to the downstream side is guided on the guiding portions 46*a*l and 46*a*2, and pushed slightly upward above the solder-flow-changing plate 46*c*, and drops from a downstream end of the solder-flow-changing plate 46*c*.

Figure 6B:
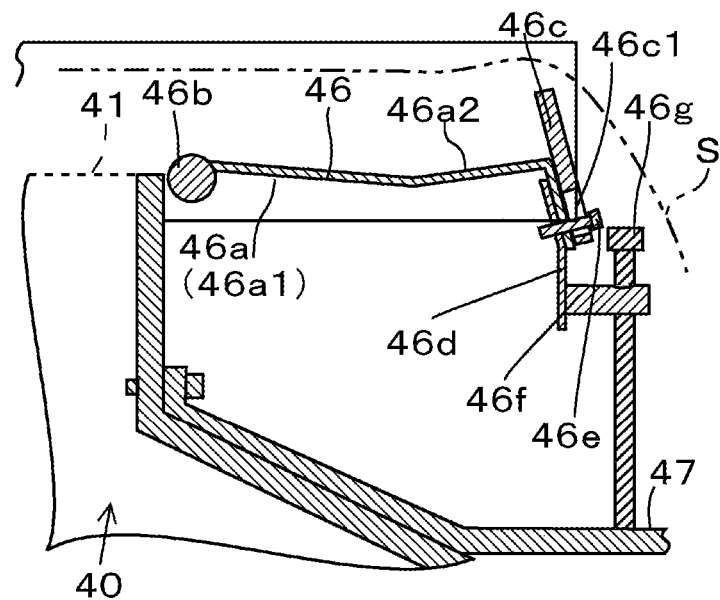
FIG. 6B is a cross-sectional view showing an operation example of the downstream-forming portion 46.

When the screws 46*e* are changed to be screwed to the lowermost position of each of the long holes 46*c*1 from this state, the height at which the solder-flow-changing plate 46*c* is mounted to the downstream forming plate 46*a* becomes the highest, as shown in FIG. 6B. In this state, the molten solder S jetted upward from the jet port 41 and guided on the guiding portions 46*a*l and 46*a*2 is pushed upward above the solder-flow-changing plate 46*c* as compared with the state shown in FIG. 6A, and then drops from the downstream end of the solder-flow-changing plate 46*c*.

Figure 6C:
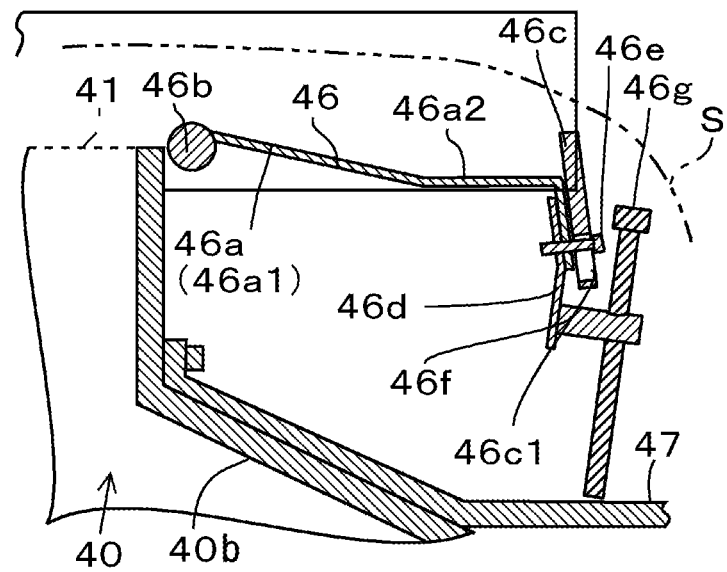
FIG. 6C is a cross-sectional view showing an operation example of the downstream-forming portion 46.

When the operator rotates the head of the bolt 46*g* from the state shown in FIG. 6A so as to be away from the protrusion portion 46*f*, the downstream forming plate 46*a*, the support plate 46*d*, the solder-flow-changing plate 46*c* and the protrusion portion 46*f* integrally rotate about the shaft 46*b* as a fulcrum, so that the protrusion portion 46*f* moves downward with respect to the axis of the bolt 46*g*. Then, as shown in FIG. 6C, rotation is performed in a direction in which a lower end of the support plate 46*d* approaches a downstream wall 40*b* of the nozzle body 40A and the downstream forming plate 46*a* moves away from the carrying rails 13. The rotation of the downstream-forming portion 46 is not limited to the rotation from the state of FIG. 6A to the state of FIG. 6C, and the downstream-forming portion 46 may be rotated in a direction approaching the carrying rails 13 by rotating the head of the bolt 46*g* in a direction approaching the protrusion portion 46*f*. Of course, the height at which the solder-flow-changing plate 46*c* is mounted to the downstream forming plate 46*a* may be changed from the state where the downstream-forming portion 46 is rotated.

As described above, the downstream-forming portion 46 can rotate with respect to the nozzle body 40A, and the height of the solder-flow-changing plate 46*c* with respect to the downstream forming plate 46*a* can be changed. So, the shape and height of the molten solder S passing over the downstream forming plate 46*a* and the solder-flow-changing plate 46*c* can be changed. Therefore, the secondary jet nozzle 40 can change a contact amount and contact time of the molten solder S jetted to the substrate 5 according to the size of the substrate and the electronic component mounted on the substrate.

Figure 11A:
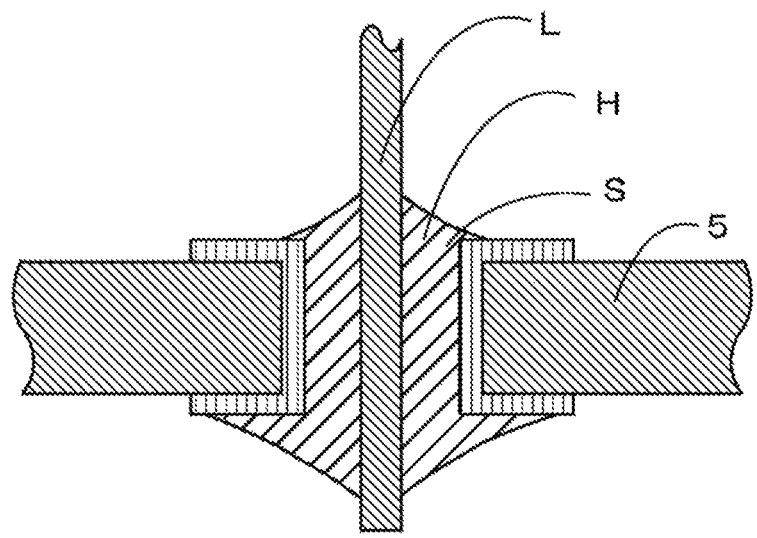
FIG. 11A is a cross-sectional view showing a state where molten solder S is sufficiently wetted and rise in a through hole H formed in a substrate 5.
Figure 11B:
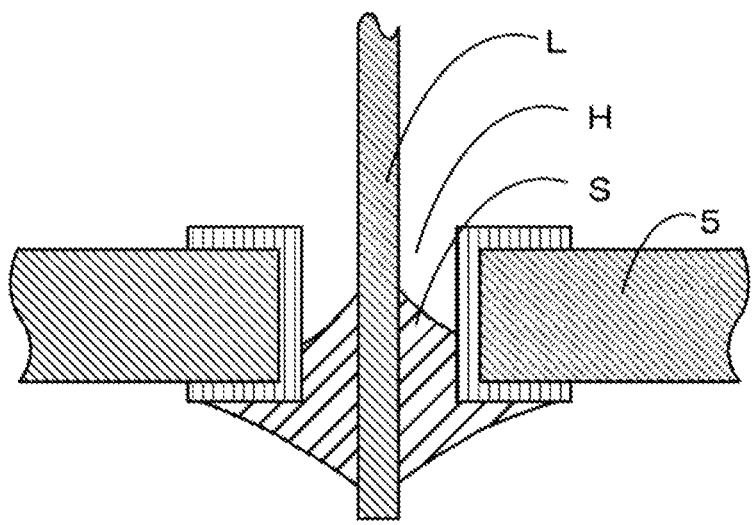
FIG. 11B is a cross-sectional view showing a state where the molten solder S is insufficiently wetted and rise in the through hole H formed in the substrate 5.

In the present embodiment, the molten solder S is jetted as rough waves from both the primary jet nozzle 30 and the secondary jet nozzle 40, so that both the molten solder S jetted from the primary jet nozzle 30 and the molten solder S jetted from the secondary jet nozzle 40 act to penetrate into a site where solder does not easily enter, such as a through hole formed in the substrate 5 or a corner of an electronic component. Therefore, even when the jet from the primary jet nozzle 30 is insufficient to wet the molten solder S and allow it to rise, the molten solder S jetted from the secondary jet nozzle 40 further penetrates, and the molten solder S is sufficiently wetted and rises in the through hole H formed in the substrate 5 upward from below, as shown in FIG. 11A. Accordingly, even when an electronic component requiring a high heat capacity is soldered to the substrate 5, it is possible to wet the molten solder S sufficiently and allow it to rise in the through hole H formed in the substrate, thereby suppressing an unsoldered state and leading to good soldering.

By providing the downstream-forming portion 46 in the present embodiment, even if the state of the solder attached to the soldered portion of the substrate 5 is not stabilized so that a solder bridge or the like is generated after soldering with rough waves from the primary jet nozzle 30 and the secondary jet nozzle 40, the generated solder bridge can be re-melted by the molten solder S guided on the downstream-forming portion 46 to correct it into a good soldered portion.

In the present embodiment, the bridge member 37 is provided between the primary jet nozzle 30 and the secondary jet nozzle 40, so that the molten solder S that has been jetted from the jet port 31 is guided toward the secondary jet nozzle 40 along the carrying direction of the substrate 5, and collides with the molten solder S that has been jetted from the secondary jet nozzle 40 above the gap 53A. Therefore, the molten solder S that has been jetted from the primary jet nozzle 30 and the molten solder S that has been jetted from the secondary jet nozzle 40 do not interfere with each other. Further, after the molten solder S that has been jetted from the primary jet nozzle 30 is attached to the substrate 5, the substrate 5 comes into contact with the molten solder S while being carried above the bridge member 37. This makes it possible to prevent the molten solder S that has been jetted from the primary jet nozzle 30 and attached to the substrate 5 from cooling and solidifying before coming into contact with the molten solder S from the secondary jet nozzle 40.

In the present embodiment, the downstream forming plate 46a has been configured to be bent, but is not limited to this. By providing the bent portion 46a3, the molten solder S that has been jetted from the jet port 41 flows from the guiding portion 46a1 toward the bent portion 46a3, and flows to the guiding portion 46a2 after being stored in the bent portion 46a3. Therefore, the molten solder S is easily guided to the downstream side as compared with the case where a flat downstream forming plate is used, and, besides, the molten solder S is stored in the bent portion 46a3, thereby making it possible to easily adjust a point at which the substrate 5 is separated from the molten solder S on the downstream forming plate, so-called peelback point.

Although the solder receiving portions 38, 39, and 47 may be omitted, the provision of the solder receiving portions 38, 39, and 47 prevents the jetted molten solder S from directly dropping onto the liquid level of the molten solder S in the present embodiment. The solder receiving portions 38, 39 and 47 may be provided with a structure for removing an oxide (dross) of solder (not shown).

[Configuration Example of Jet Solder Bath 20B of Second Embodiment]

The following will describe a jet solder bath 20B of a second embodiment in which a tertiary jet nozzle (third jet nozzle) is provided at the downstream side of the secondary jet nozzle (second jet nozzle) in the substrate carrying direction with reference to each drawing. The jet solder bath 20B is an example of the jet solder bath 20 provided in the jet soldering device 1. In the jet solder bath 20B, the same reference numerals are added to the same members as those of the jet solder bath 20A of the first embodiment, and a detailed description thereof is omitted.

Figure 7:
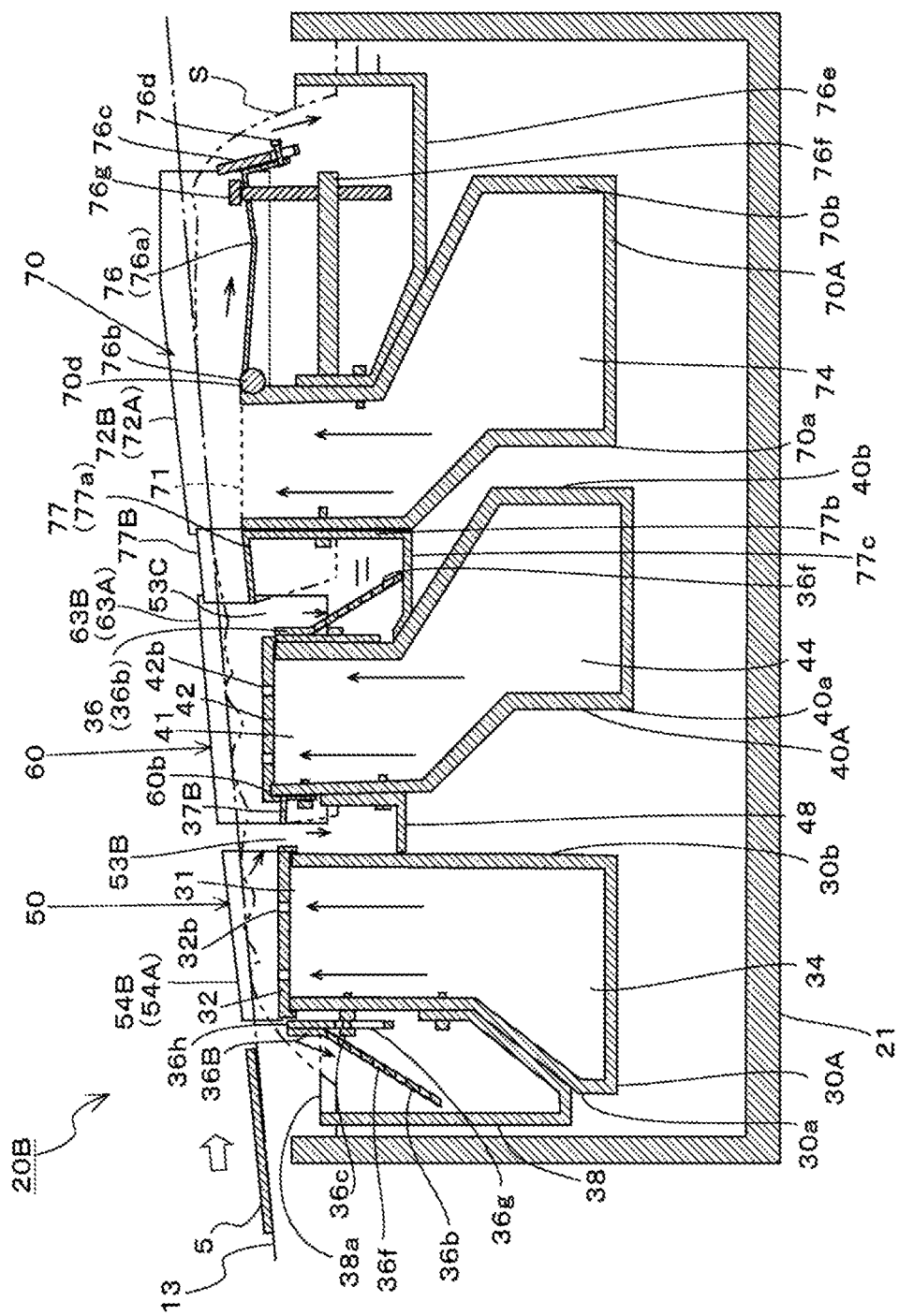
FIG. 7 is a schematic cross-sectional view showing a configuration example of a jet solder bath 20B according to a second embodiment of the present invention.

As shown in FIG. 7, the jet solder bath 20B includes the solder bath body 21 which contains the molten solder S, and a primary jet nozzle 50 as a first jet nozzle provided above in the solder bath body 21, a secondary jet nozzle 60 as a second jet nozzle arranged at the downstream side of the primary jet nozzle 50 and a tertiary jet nozzle 70 as a third jet nozzle arranged at the downstream side of the secondary jet nozzle 60 are provided in the solder bath body 21. A first jet pump (not shown) is installed in a lower portion of the primary jet nozzle 50 via a duct (not shown), a second jet pump (not shown) is installed in a lower portion of the secondary jet nozzle 60 via a duct (not shown), and a third jet pump (not shown) is installed in a lower portion of the tertiary jet nozzle 70 via a duct (not shown).

The primary jet nozzle 50 includes the nozzle body 30A that is open at the top and bottom, and the solder-flow-forming plate 32 provided with the plurality of jet holes 32b for jetting the molten solder S from the jet port 31. The nozzle body 30A has therein a hollow portion 34 having a rectangular bottom surface.

The jet port 31 is provided with side plates 54A and 54B, and the side plates 54A and 54B extend from a top of the upstream wall 30a of the nozzle body 30A to a top of the downstream wall 30b. The side plates 54A and 54B protrude upward from the molten solder S to be jetted from the jet port 31, so that the molten solder S jetted from the jet port 31 does not flow down in the direction orthogonal to the carrying direction of the substrate 5.

A guide plate 36B is provided above the upstream side of the wall 30a. The guide plate 36B is configured such that the position where it is mounted to the nozzle body 30A can be changed in the vertical direction from the guide plate 36 described in the first embodiment. The nozzle body 30A is further provided with the solder receiving portion 38 for receiving the molten solder S that has been jetted from the jet port 31 and has dropped to the upstream side of the nozzle body 30A.

The guide plate 36B has a mounting portion 36h attached to the wall 30a of the nozzle body 30A with the screw 36c, and the guide portion 36b joined to the mounting portion 36h on a side opposite to the nozzle body 30A and provided with the plurality of holes 36f. The mounting portion 36h is provided with a vertically long hole 36g, and is screwed to the nozzle body 30A with the screw 36c through the long hole 36g and a screw hole provided on an upper portion of the wall 30a. By changing the height at which the screw 36c is screwed in the long hole 36g, the height at which the guide plate 36B is attached to the primary jet nozzle 50 can be changed vertically.

Figure 4A:
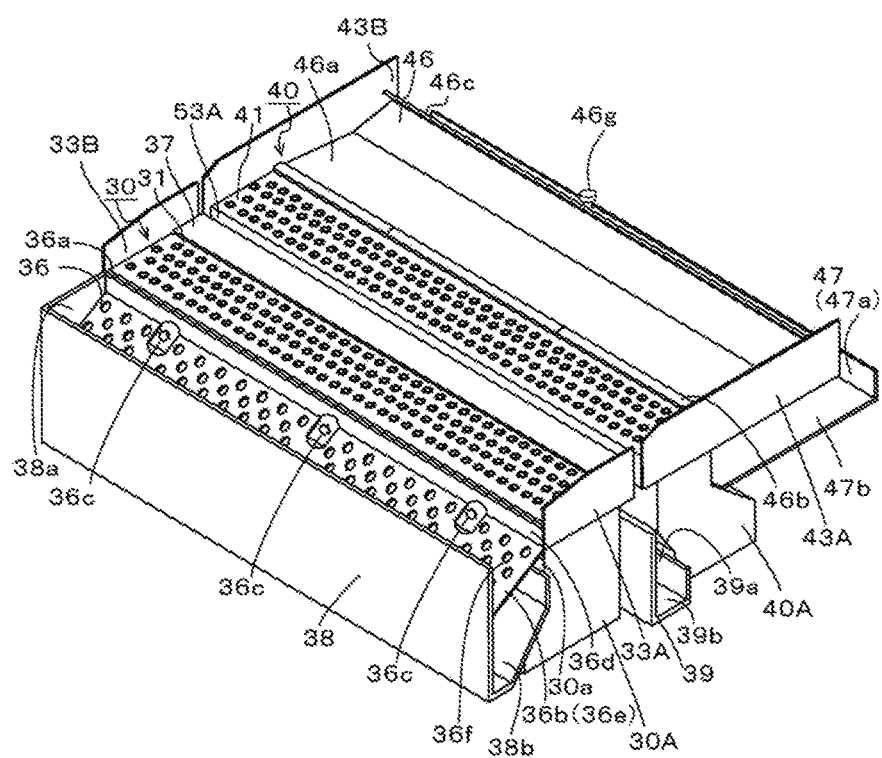
FIG. 4A is a perspective view showing a configuration example of a primary jet nozzle 30 and a secondary jet nozzle 40.
Figure 4B:
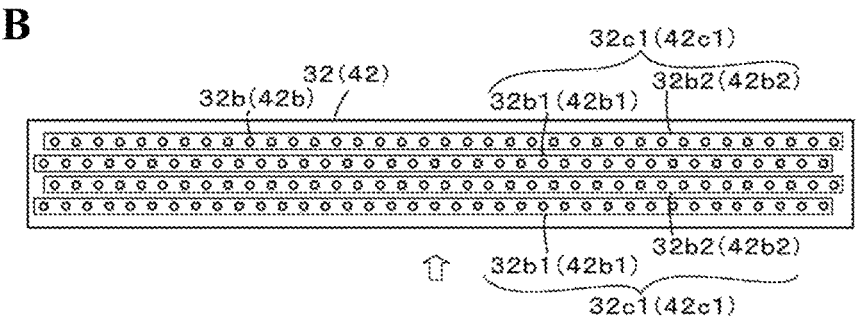
FIG. 4B is a plan view showing a configuration example of a solder-flow-forming plate 32 or 42.

The solder receiving portion 38 has a container shape having an open upper end 38a and an opening 38b on its one side, and is screwed to the wall 30a, as shown in FIG. 4A. The guide portion 36b of the guide plate 36B is accommodated in the solder receiving portion 38.

The secondary jet nozzle 60 includes the nozzle body 40A that is open at the top and bottom, and the solder-flow-forming plate 42 provided with the plurality of jet holes 42b for jetting the molten solder S from the jet port 41. The nozzle body 40A has therein a hollow portion 44 having a rectangular bottom surface.

A bridge member 37B is provided between the primary jet nozzle 50 and the secondary jet nozzle 60. The secondary jet nozzle 60 is provided, below the bridge member 37B, with the solder receiving portion 48 for receiving the molten solder S that has been jetted from the jet port 41 and has dropped to the upstream side of the nozzle body 40A. The secondary jet nozzle 60 is also provided with the guide plate 36 above the downstream wall 40b of the nozzle body 40A.

The jet port 41 is provided with side plates 63A and 63B, and the side plates 63A and 63B protrude above the molten solder S to be jetted from the jet port 41, so that the molten solder S jetted from the jet port 41 does not flow down in the direction orthogonal to the carrying direction of the substrate 5. The side plates 63A and 63B also extend to the sides of the guide plate 36, thus regulate the molten solder S dropping from the downstream side of the jet port 41 in such a manner that the molten solder S does not flow down in the direction orthogonal to the carrying direction of the substrate 5.

The bridge member 37B is screwed to an upper portion of the upstream wall 40a of the nozzle body 40A, and extends toward the wall 30b of the primary jet nozzle 50. An upper surface of the bridge member 37B is provided in parallel with the solder-flow-forming plate 42, and guides the flow of the molten solder S that has been jetted from the jet port 41 and has not been attached to the substrate 5 to the upstream side. The length from an upstream end to a downstream end of the bridge member 37B is shorter than the distance between the primary jet nozzle 50 and the secondary jet nozzle 60, and a gap 53B is provided between the upstream end of the bridge member 37B and a downstream upper end of the primary jet nozzle 50.

The width of the bridge member 37B orthogonal to the carrying direction of the substrate 5 is the same as the width of the jet port 41 orthogonal to the carrying direction of the substrate 5. The side plates 63A and 63B also extend to the sides of the bridge member 37B, and thus regulate the molten solder S guided on the bridge member 37B in such a manner that the molten solder S does not flow down in the direction orthogonal to the carrying direction of the substrate 5, and smoothens the surface of the flow of the molten solder S on the bridge member 37B.

The gap 53B forms a hole near the primary jet nozzle 50 along the direction orthogonal to the carrying direction of the substrate 5. To prevent the molten solder S that has been jetted from the primary jet nozzle 50 and the molten solder S that has been jetted from the secondary jet nozzle 60 from interfering with each other, and to prevent the molten solder S that has been jetted from the primary jet nozzle 50 and attached to the substrate 5 from cooling and solidifying, the length of the gap 53B from the upstream end thereof to the downstream end thereof is preferably, for example, 5 mm or more and 7 mm or less. Therefore, the length of the bridge member 37B along the flow direction of the molten solder S guided on the bridge member 37B is preferably shorter by 5 mm or more and 7 mm or less than the distance between the wall 30b of the primary jet nozzle 50 and the wall 40a of the secondary jet nozzle 60. However, it can be changed depending on various factors such as the size of the substrate, the carrying speed thereof, the type of solder used for performing the soldering process, and the setting of the melting temperature of the molten solder.

The solder receiving portion 48 has an L shape obtained by bending a flat plate, and is screwed to the wall 40a of the nozzle body 40A. The upper end of the solder receiving portion 48 protrudes upward from the liquid level of the molten solder S. The bottom of the solder receiving portion 48 is located below the gap 53B. The upstream end of the bottom of the solder receiving portion 48 comes into contact with the wall 30b.

The tertiary jet nozzle 70 includes a nozzle body 70A that is open at the top and bottom, and jets the molten solder S from a jet port 71 that is an opening at an upper end of the nozzle body 70A. Between the secondary jet nozzle 60 and the tertiary jet nozzle 70, a solder guiding member 77 having both functions of a bridge member and a solder receiving portion is provided. At an upper end 70d of a downstream wall 70b of the nozzle body 70A, a downstream-forming portion 76 (rear former) for shaping the molten solder flow to change the jet flow width is provided. The nozzle body 70A has a hollow portion 74 having a rectangular bottom surface, and the upper side of the hollow portion 74 is closer to the secondary jet nozzle 60 than the lower side thereof.

The jet port 71 protrudes upward from the liquid level of the molten solder S. The jet port 71 is provided with side plates 72A and 72B extending up to the sides of the downstream-forming portion 76, and the side plates 72A and 72B protrude upward from the molten solder S to be jetted from the jet port 71, so that the molten solder S jetted from the jet port 71 does not flow down in the direction orthogonal to the carrying direction of the substrate 5.

The guiding member 77 is provided on an upper side of an upstream wall 70a of the tertiary jet nozzle 70, and has a guiding portion 77a extending from an upper end of the wall 70a toward the downstream side of the secondary jet nozzle 60, a mounting portion 77b bent downward from a downstream end of the guiding portion 77a and screwed to the wall 70a, and a bottom 77c bent from the mounting portion 77b toward the secondary jet nozzle 60. The guiding member 77 has both open ends along the direction orthogonal to the carrying direction of the substrate 5.

The guiding portion 77a extends so that it is in parallel with the carrying rails 13, and guides the molten solder S jetted from the jet port 71 and flown to the upstream side. The width of the guiding portion 77a along the direction orthogonal to the carrying direction of the substrate 5 is the same length as the width of the jet port 71 along the direction orthogonal to the carrying direction of the substrate 5. A gap 53C is opened between an upstream end of the guiding portion 77a and the upper end of the downstream wall 40b of the secondary jet nozzle 60. The guiding portion 77a has side guides 77B near the both ends orthogonal to the carrying direction of the substrate 5 over the entire length of the guiding portion 77a along the carrying direction of the substrate 5. The side guides 77B are each bent upward from the guiding portion 77a, regulate the molten solder S moving on the guiding portion 77a in such a manner that the molten solder S does not flow down in the direction orthogonal to the carrying direction of the substrate 5, and smoothen the surface of the flow of the molten solder S.

Since the side plates 72A and 72B of the tertiary jet nozzle 70 are provided in connection with the side guides 77B of this guiding portion 77a, the molten solder S is regulated so as not to flow down in the direction orthogonal to the carrying direction of the substrate 5 by the side guides 77B of the guiding portion 77a and the side plates 72A and 72B of the tertiary jet nozzle 70.

The bottom 77c is bent from a lower end of the mounting portion 77b toward the secondary jet nozzle 60, and an upstream end of the bottom 77c is bent along the wall 40b. Of course, a portion where the bottom 77c is bent along the wall 40b may be fixed to the nozzle body 40A with a screw (not shown) or the like.

The gap 53C forms a hole near the secondary jet nozzle 60 along the direction orthogonal to the carrying direction of the substrate 5. To prevent the molten solder S that has been jetted from the secondary jet nozzle 60 and the molten solder S that has been jetted from the tertiary jet nozzle 70 from interfering with each other, and to prevent the molten solder S that has been jetted from the primary jet nozzle 50 and the secondary jet nozzle 60 and attached to the substrate 5 from cooling and solidifying, the length of the gap 53C from the upstream end thereof to the downstream end thereof is preferably, for example, 5 mm or more and 7 mm or less. Therefore, the length of the guiding portion 77a in the flow direction of the molten solder S guided through the guiding portion 77a is preferably shorter by 5 mm or more and 7 mm or less than the distance between the upper end of the downstream wall 40b of the secondary jet nozzle 60 and the upper end of the upstream wall 70a of the tertiary jet nozzle 70. However, it can be changed depending on various factors such as the size of the substrate, the carrying speed thereof, the type of solder used for performing the soldering process, and the setting of the melting temperature of the molten solder, as described above.

The guide plate 36 is provided in a space surrounded by the gap 53C, the lower side of the guiding portion 77a, the upper side of the bottom 77c, and the upstream side of the mounting portion 77b.

The downstream-forming portion 76 includes a downstream forming plate 76a that forms the molten solder S that is jetted from the jet port 71 and flows to the downstream side, a shaft 76b for rotating the downstream forming plate 76a with respect to the nozzle body 70A, a solder-flow-changing plate 76c attached to a downstream end of the downstream forming plate 76a, screws 76d for fixing the solder-flow-changing plate 76c to the downstream forming plate 76a, a support portion 76e provided on the downstream wall 70b of the nozzle body 70A, a protrusion portion 76f protruding to the downstream side with respect to the nozzle body 70A, and a bolt 76g inserted into a screw hole formed in the protrusion portion 76f.

Figure 8A:
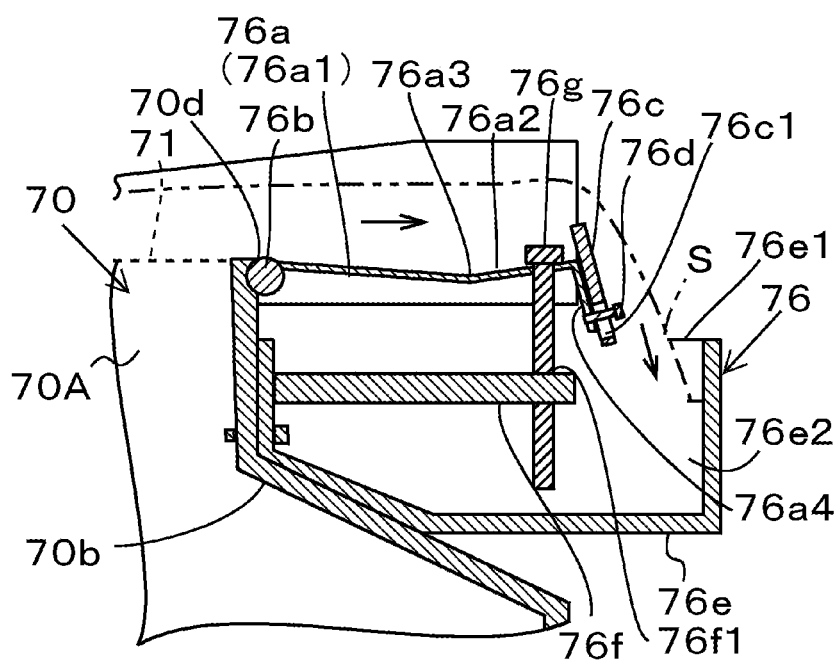
FIG. 8A is a cross-sectional view showing an operation example of a downstream-forming portion 76.

As shown in FIG. 8A, the downstream forming plate 76a has a guiding portion 76a1 that guides the flow of the molten solder S to the downstream side along the carrying direction of the substrate 5, a guiding portion 76a2 that is bent upward from a bent portion 76a3 which is a downstream end of the guiding portion 76a1, and a mounting portion 76a4 that is bent downward at a downstream end of the guiding portion 76a2.

The guiding portion 76a1 extends from the shaft 76b such that the downstream side is located below. The guiding portion 76a2 is provided with a vertically penetrated hole, into which the bolt 76g is fitted so that it can rotate, but does not move in the vertical direction. The mounting portion 76a4 extends toward the liquid level side of the molten solder S, and has a screw hole into which the screws 76d mounted to the solder-flow-changing plate 76c are screwed.

The shaft 76b is provided at an upstream end of the guiding portion 76a1 and extends orthogonally to the carrying direction of the substrate 5. The shaft 76b is rotatably mounted to the upper end 70d of the downstream wall 70b of the nozzle body 70A.

The solder-flow-changing plate 76c is provided with vertically long holes 76c1. The solder-flow-changing plate 76c is fixed to the downstream forming plate 76a, by the screws 76d, via the long holes 76c1 and screw holes provided in the mounting portion 76a4. Therefore, the height of the solder-flow-changing plate 76c with respect to the downstream forming plate 76a can be vertically changed by changing the height at which the screws 76d are screwed with respect to the long holes 76c1.

The support portion 76e has both functions of a support portion for supporting the bolt 76g and a solder receiving portion. The support portion 76e has a container shape having an open upper end 76e1 and an opening 76e2 on its one side, and is screwed to the wall 70b of the nozzle body 70A. The upper end 76e1 of the support portion 76e protrudes upward from the liquid level of the molten solder S. The width of the support portion 76e orthogonal to the carrying direction of the substrate 5 is the same as or larger than that of the nozzle body 70A.

The protrusion portion 76f protrudes orthogonally from an inner wall of the support portion 76e on the side attached to the nozzle body 70A toward a direction opposite to the nozzle body 70A. The protrusion portion 76f is provided with a screw hole 76f1 to which is vertically penetrated in a direction orthogonal with respect to the direction in which the protrusion portion 76f protrudes from the support portion 76e.

A shaft of the bolt 76g extends downward so that the shaft tip faces the support portion 76e. When the bolt 76g is rotated in a direction in which a head of the bolt 76g approaches or moves away from the protrusion portion 76f, the downstream forming plate 76a and the solder-flow-changing plate 76c rotate integrally around the shaft 76b as a fulcrum.

[Operation Example of Jet Solder Bath 20B]

Next, an operation example will be described. It is assumed that the operator performs various settings using the operation unit 81 (not shown) so that each portion is operated by the control unit 80. The operation of the entire jet soldering device 1 has been described in the first embodiment, and will not be described.

By driving the first jet pump (not shown) connected to the primary jet nozzle 30, the molten solder S enters the hollow portion 34 via the duct (not shown) as indicated by black arrows in FIG. 7, rises in the nozzle body 30A, and jets from the jet holes 32b formed in the solder-flow-forming plate 32 provided at the jet port 31. The molten solder S jetted from the jet port 31 comes into contact with and is attached to the substrate 5 carried by the carrying rails 13. The molten solder S jetted from the primary jet nozzle 50 forms a rough wave, and penetrates into a site where the solder does not easily enter, such as a through hole formed in the substrate 5 or a corner of an electronic component.

The molten solder S that has been jetted from the jet holes 32b and has not been attached to the substrate 5 flows down from the upstream side of the nozzle body 30A and the gap 53B. The molten solder S having flowed downward from the upstream side of the nozzle body 30A and hit the guide plate 36B drops into the solder receiving portion 38 along the inclination of the guide portion 36b or through the holes 36f. The molten solder S having dropped into the solder receiving portion 38 returns to the liquid level of the molten solder S stored in the solder bath body 21 from the opening 38b shown in FIG. 4A.

The molten solder S that has not attached to the substrate 5 and has moved to the downstream side of the nozzle body 30A drops into the solder receiving portion 48 from the gap 53B. The molten solder S having dropped into the solder receiving portion 48 returns to the liquid level of the molten solder S stored in the solder bath body 21 from the side of the solder receiving portion 48 orthogonal to the carrying direction of the substrate 5.

By driving the second jet pump (not shown) connected to the secondary jet nozzle 60, the molten solder S enters the hollow portion 44 through the duct (not shown), rises in the secondary jet nozzle 40, and jets from the jet holes 42b formed in the solder-flow-forming plate 42 provided at the jet port 41. The molten solder S jetted from the jet port 41 comes into contact with and is attached to the substrate 5 carried by the carrying rails 13. The molten solder S jetted from the secondary jet nozzle 60 forms a rough wave, and penetrates into a site where the solder does not easily enter, such as a through hole formed in the substrate 5 or a corner of an electronic component.

In the molten solder S jetted from the jet holes 42b, the molten solder S having flowed to the upstream side of the jet port 41 flows on the bridge member 37B to a side of the primary jet nozzle 50, and drops from the gap 53B toward the solder receiving portion 48. The molten solder S is received by the solder receiving portion 48, and then returns to the liquid level of the molten solder S stored in the solder bath body 21 from the side of the solder receiving portion 48.

Since the bridge member 37B is provided in parallel with the carrying rails 13 and there is nothing on the bridge member 37B that opposes the flow of the molten solder S, the molten solder S flowing on the bridge member 37B can form a flat wave along the carrying direction of the substrate 5. Therefore, a decrease in the temperature of the substrate 5 passing over the bridge member 37B can be suppressed, and thus the molten solder S that has been jetted from the primary jet nozzle 50 and attached to the substrate 5 does not cool or solidify. Therefore, the molten solder S can be further wetted and rise in the through hole formed in the substrate 5 and the like through the subsequent secondary jet nozzle 60.

In the molten solder S jetted from the jet holes 42*b*, the molten solder S having flowed to the downstream side of the jet port 41 drops from the gap 53C toward the bottom 77*c* of the guiding member 77. Since the guide plate 36 is provided below the gap 53C and above the bottom 77*c*, the molten solder S that has flowed downward from the gap 53C and hit the guide portion 36*b* drops onto the bottom 77*c* along the inclination of the guide portion 36*b* or through the holes 36*f*. The molten solder S having dropped into the bottom 77*c* returns to the liquid level of the molten solder S stored in the solder bath body 21 from the side of the guiding member 77 orthogonal to the carrying direction of the substrate 5.

By providing the guide plate 36 in the secondary jet nozzle 60, even if the molten solder S jetted from the jet holes 42*b* is cooled so that a solder ball is formed, the solder ball smoothly drops onto the bottom 77*c* of the guiding member 77 by the guide portion 36*b* and the holes 36*f*, thereby making it possible to prevent the solder ball from being attached to the substrate 5 or entering between terminals provided on the substrate 5.

By driving the third jet pump (not shown) connected to the tertiary jet nozzle 70, the molten solder S enters the hollow portion 74 through the duct (not shown), rises in the tertiary jet nozzle 70, and jets from the jet port 71. The molten solder S jetted from the jet port 71 comes into contact with, and is attached to the substrate 5 carried by the carrying rails 13 to be used for soldering. Even when rough waves from the primary jet nozzle 50 and the secondary jet nozzle 60 are attached to the substrate 5 so that a soldering failure occurs therein, a gentle flow of the molten solder S from the tertiary jet nozzle 70 corrects the soldering failure.

In the molten solder S jetted from the jet port 71, the molten solder S having flowed to the upstream side of the jet port 71 flows on the guiding portion 77*a* toward a side of the secondary jet nozzle 60 so as to be in parallel with the carrying direction of the substrate 5, and flows down from the gap 53C to the bottom 77*c* via the guide plate 36. The molten solder S having dropped into the bottom 77*c* returns to the liquid level of the molten solder S stored in the solder bath body 21 from the side of the guiding member 77 orthogonal to the carrying direction of the substrate 5.

Since the guiding portion 77*a* is provided in parallel with the carrying rail 13 and there is nothing on the guiding portion 77*a* that opposes the flow of the molten solder S, the molten solder S flowing on the guiding portion 77*a* can form a flat wave along the carrying direction of the substrate 5. Therefore, a decrease in the temperature of the substrate 5 passing over the guiding portion 77*a* can be suppressed, and thus the molten solder S that has been jetted from the primary jet nozzle 50 and the secondary jet nozzle 60 and attached to the substrate 5 does not cool or solidify. Therefore, uniform soldering can be performed through the subsequent tertiary jet nozzle 70.

In the molten solder S jetted from the jet port 71, the molten solder S having flowed to the downstream side of the jet port 71 passes over the downstream-forming portion 76, flows down into the support portion 76*e* from the downstream side of the solder-flow-changing plate 76*c*, and then returns to the liquid level of the molten solder S stored in the solder bath body 21 from the opening 76*e*2.

As shown in FIG. 1, the carrying rails 13 carry the soldered substrate 5 to the cooler 17. The cooling fan (not shown) of the cooler 17 cools the soldered substrate 5 for a predetermined time. After cooling of the substrate 5, when the carrying rails 13 discharge the substrate 5 from the carry-out port 12, the soldering process by means of the jet soldering device 1 is completed.

Here, the operation of the downstream-forming portion 76 will be described. FIG. 8A shows a state where the screws 76*d* are screwed at an uppermost position of each of the long holes 76*c*1 so that the solder-flow-changing plate 76*c* is mounted to the downstream forming plate 76*a* at the lowest position. In this state, the molten solder S that has been jetted from the jet port 71 toward the carrying rails 13 located above and flowed to the downstream side is guided on the guiding portions 76*a*1 and 76*a*2, and pushed slightly upward above the solder-flow-changing plate 76*c*, and drops from a downstream end of the solder-flow-changing plate 76*c*.

Figure 8B:
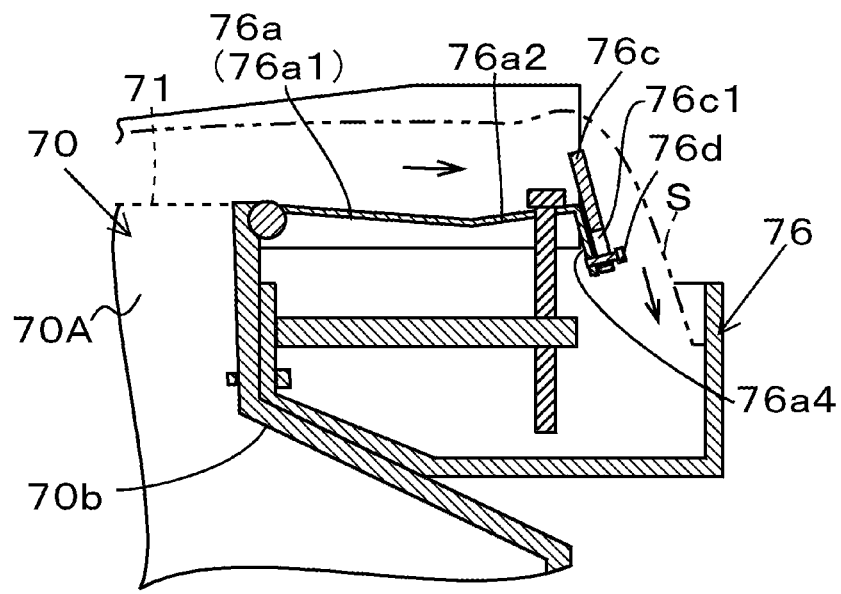
FIG. 8B is a cross-sectional view showing an operation example of the downstream-forming portion 76.

When the screws 76*d* are so changed as to be screwed to the lowermost position of each of the long holes 76*c*1 from this state, the height at which the solder-flow-changing plate 76*c* is mounted to the downstream forming plate 76*a* becomes the highest, as shown in FIG. 8B. In this state, the molten solder S jetted upward from the jet port 71 and guided on the guiding portions 76*a*1 and 76*a*2 is pushed upward above the solder-flow-changing plate 76*c* as compared with the state shown in FIG. 8A, and then drops from the downstream end of the solder-flow-changing plate 76*c*.

Figure 8C:
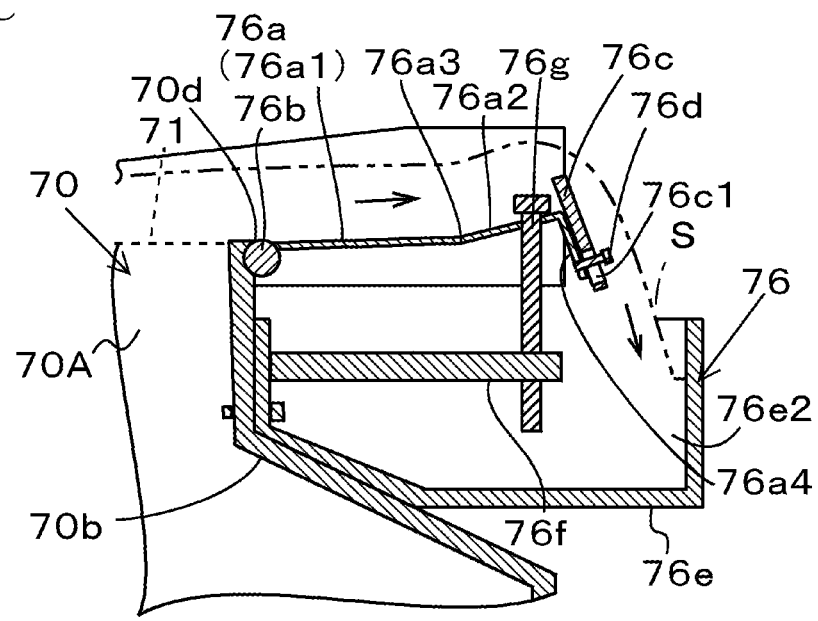
FIG. 8C is a cross-sectional view showing an operation example of the downstream-forming portion 76.

When the operator rotates the head of the bolt 76*g* so as to be away from the protrusion portion 76*f* from the state shown in FIG. 8A, the downstream forming plate 76*a* follows the movement of the bolt 76*g*, and the downstream forming plate 76*a* and the solder-flow-changing plate 76*c* integrally rotate about the shaft 76*b* as a fulcrum. Then, as shown in FIG. 8C, rotation is performed in a direction in which a lower end of the bolt 76*g* moves away from the support portion 76*e* and the downstream forming plate 76*a* approaches the carrying rails 13. The rotation of the downstream-forming portion 76 is not limited to the rotation from the state of FIG. 8A to the state of FIG. 8C, and the downstream-forming portion 76 may be rotated in a direction moving away from the carrying rails 13 by rotating the head of the bolt 76*g* in a direction approaching the protrusion portion 76*f*, not shown. Of course, the height at which the solder-flow-changing plate 76*c* is mounted to the downstream forming plate 76*a* may be changed from the state where the downstream-forming portion 76 is rotated.

As described above, the downstream-forming portion 76 can rotate with respect to the nozzle body 70A, and the height of the solder-flow-changing plate 76*c* with respect to the downstream forming plate 76*a* can be changed. So, the shape and height of the molten solder S passing over the downstream forming plate 76*a* and the solder-flow-changing plate 76*c* can be changed. Therefore, the tertiary jet nozzle 70 can change a contact amount and contact time of the molten solder S jetted to the substrate 5 according to the size of the substrate and the electronic component mounted on the substrate.

In the present embodiment, the molten solder S is jetted as rough waves from both the primary jet nozzle 50 and the secondary jet nozzle 60, so that both the molten solder S jetted from the primary jet nozzle 50 and the molten solder S jetted from the secondary jet nozzle 60 act to penetrate into a site where solder does not easily enter, such as a through hole formed in the substrate 5 or a corner of an electronic component. Therefore, even when the primary jet nozzle 50 is insufficient to wet the molten solder S and allow it to rise, the molten solder S jetted from the secondary jet nozzle 60 further penetrates, and the molten solder S is sufficiently wetted and rises in the through hole H formed in the substrate 5 upward from below, as shown in FIG. 11A. Accordingly, even when an electronic component requiring a high heat capacity is soldered to the substrate 5, it is possible to wet the molten solder S sufficiently and allow it to rise in the through hole H formed in the substrate, thereby suppressing an unsoldered state and leading to good soldering.

The bridge member 37B is provided between the primary jet nozzle 50 and the secondary jet nozzle 60, so that the molten solder S that has been jetted from the jet port 41 is guided toward the primary jet nozzle 50 along the carrying direction of the substrate 5, and collides with the molten solder S that has been jetted from the primary jet nozzle 50 above the gap 53B. Therefore, after the molten solder S that has been jetted from the primary jet nozzle 50 is attached to the substrate 5, the molten solder S comes into contact also with the substrate 5 carried above the bridge member 37B. This makes it possible to prevent the molten solder S that has been jetted from the primary jet nozzle 50 and attached to the substrate 5 from cooling and solidifying before coming into contact with the molten solder S from the secondary jet nozzle 60.

In the present embodiment, the guiding member 77 is provided between the secondary jet nozzle 60 and the tertiary jet nozzle 70, so that the molten solder S that has been jetted from the jet port 71 is guided toward the secondary jet nozzle 60 along the carrying direction of the substrate 5, and collides with the molten solder S that has been jetted from the secondary jet nozzle 60 above the gap 53C. Therefore, after the molten solder S that has been jetted from the secondary jet nozzle 60 is attached to the substrate 5, the molten solder S comes into contact also with the substrate 5 carried above the guiding member 77. This makes it possible to prevent the molten solder S that has been jetted from the secondary jet nozzle 60 and attached to the substrate 5 from cooling and solidifying before coming into contact with the molten solder S from the tertiary jet nozzle 70.

In the present embodiment, the downstream forming plate 76a has been configured to be bent, but is not limited to this. By providing the bent portion 76a3, the molten solder S that has been jetted from the jet port 71 flows from the guiding portion 76a1 toward the bent portion 76a3, and flows to the guide portion 76a2 after being stored in the bent portion 76a3. Therefore, the molten solder S is easily guided to the downstream side as compared with the case where a flat downstream forming plate is used, and, besides, the molten solder S is stored in the bent portion 76a3, thereby making it possible to easily adjust a point at which the substrate 5 is separated from the molten solder S on the downstream forming plate, so-called peelback point.

The guide plates, bridge members, guiding members, solder receiving portions, support portions, and downstream-forming portions described in the above embodiments are easily attachable to and detachable from conventional jet nozzles. Note that the arrangement of the guide plates 36 and 36B is not limited to that described in the above embodiments. They may be provided between the primary jet nozzle and the secondary jet nozzle, or may be provided on the downstream wall of the tertiary jet nozzle. Further, the method of attaching each guide plate to the jet nozzle is not limited to the examples shown for the guide plates 36 and 36B, and the guide plate may be configured to have a shaft and be rotatable like the downstream-forming portion.

Although the lengths of the bridge members 37 and 37B and the guiding member 77 have been shorter than the lengths of the adjacent nozzle bodies so as to form the gaps 53A to 53C, the present invention is not limited to them. The lengths of the bridge members 37 and 37B and the guiding member 77 along the carrying direction of the substrate 5 may be the same as or longer than the distance between the adjacent nozzle bodies. In such a case, instead of the gaps 53A to 53C, slits or the like may be provided in the bridge members 37, 37B and the guiding member 77 to form holes along the direction orthogonal to the carrying direction of the substrate 5, so that the molten solder S is dropped from such slits or the like. Further, the slit may be provided over the entire length in the direction orthogonal to the carrying direction of the substrate 5, or may be divided into a plurality of parts in the direction. Even when the molten solders S jetted from the adjacent jet nozzles collide with each other, the molten solder S drops from the gaps 53A to 53C, slits, etc., so that the collision of the molten solders S jetted from the jet nozzles does not have influence on the substrate 5. In addition, it is possible to suppress overflow, in which the molten solder S rises even above the substrate 5.

Although, in the above-described embodiments, the guiding member 77 has been provided with the side guides 77B and the side guides 77B have been respectively provided over the entire length of the guiding portion 77a along the carrying direction of the substrate 5, the present invention is not limited thereto. The side guide 77B near the upstream end of the guiding portion 77a may be cut out, so that the molten solder S may be dropped from the cutout portion toward the liquid level of the molten solder S contained in the solder bath body 21. When a cutout is provided in the side guide 77B, it is not necessary to provide a gap, a slit, or the like for dropping the molten solder S.

If side guides are also provided on the bridge members 37 and 37B, it is not necessary to extend the respective side plates to the sides of the bridge members 37 and 37B. On the other hand, the side plates 72A and 72B may each be extended to the sides of the guiding member 77, and the side guide 77B may be omitted.

Although, in the above-described embodiments, the downstream-forming portions 46 and 76 have been provided, the downstream-forming portion 46 may be omitted, and the configuration of the downstream-forming portions 46 and 76 is not limited to the above-described examples. The downstream-forming portions may each be joined to the upper end of the downstream wall of the secondary jet nozzle or the tertiary jet nozzle, attached like a bridge member 37B, or attached so as to be able to move up and down like the guide plate 36B.

Figure 9:
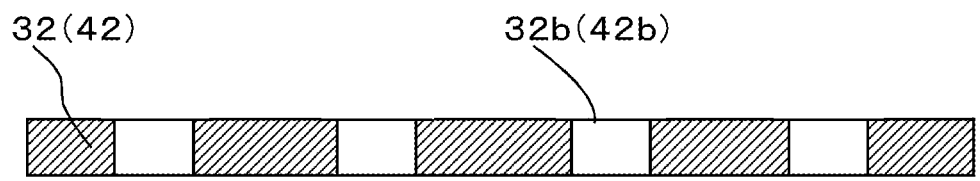
FIG. 9 is a cross-sectional view showing a configuration example of the solder-flow-forming plate 32 or 42.
Figure 10A:
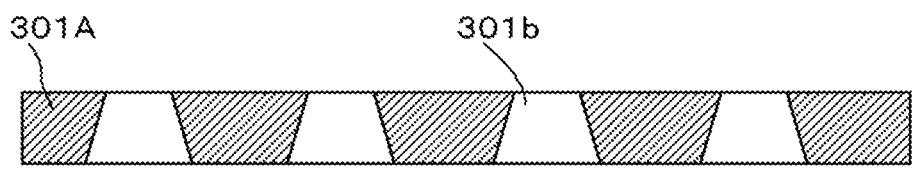
FIG. 10A is a cross-sectional view showing a configuration example of any of solder-flow-forming plates 301A to 304A.
Figure 10B:
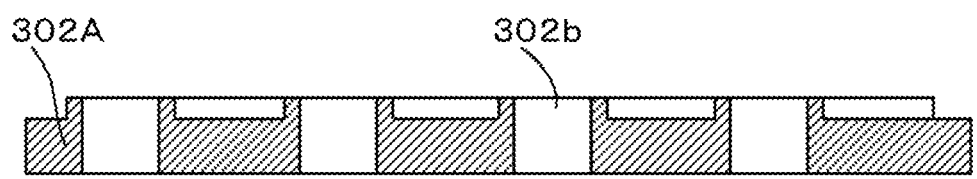
FIG. 10B is a cross-sectional view showing a configuration example of any of the solder-flow-forming plates 301A to 304A.
Figure 10C:
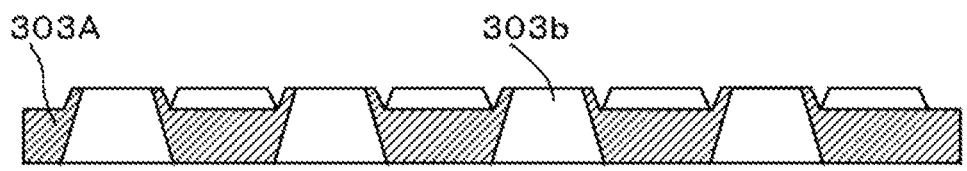
FIG. 10C is a cross-sectional view showing a configuration example of any of the solder-flow-forming plates 301A to 304A.
Figure 10D:
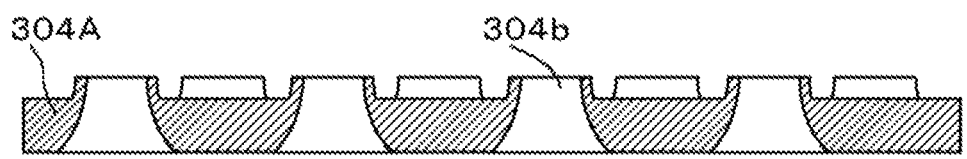
FIG. 10D is a cross-sectional view showing a configuration example of any of the solder-flow-forming plates 301A to 304A.

As shown in FIG. 9, the jet holes 32b of the solder-flow-forming plate 32 and the jet holes 42b of the solder-flow-forming plate 42 according to the present embodiments have been formed so that the jet holes 32b, 42b are opened at the flat solder-flow-forming plates 32 and 42, and the cross sections of the jet holes 32b and 42b have been rectangular. However, the present invention is not limited to this. For example, as shown in FIG. 10A, a solder-flow-forming plate 301A may be formed so that jet holes 301b each having a trapezoidal cross section are opened in a flat solder-flow-forming plate 301A. That is, each of the jet holes 301b may have a shape such that the oral cavity becomes smaller as going upward. Further, for example, as shown in FIG. 10B, each jet hole 302b of a solder-flow-forming plate 302A may have a shape protruding from the solder-flow-forming plate 302A in an orthogonal direction, and may have a rectangular cross section. As shown in FIG. 10C, each jet hole 303b of a solder-flow-forming plate 303A may have a shape protruding from the solder-flow-forming plate 303A, and may have a trapezoidal cross section. As shown in FIG. 10D, each jet hole 304b of a solder-flow-forming plate 304A may have a shape protruding from the solder-flow-forming plate 304A, and may also have a conical shape whose inclined surface is curved.

Although the solder-flow-forming plates 32 and 42 are provided in parallel with the liquid level of the molten solder S, the present invention is not limited to this. For example, the solder-flow-forming plates 32 and 42 may be provided along the carrying direction of the substrate 5. Further, different members may be used for the solder-flow-forming plates 32 and 42, and different jet holes may be provided. Since the jet holes 301b, 303b, 304b are tapered, the molten solder S can be jetted with a smaller force. Therefore, for example, if the jet holes 32b are used for the solder-flow-forming plate 32 and the jet holes 301b, 303b or 304b are used for the solder-flow-forming plate 42, even when the pressure of the jet pump connected to the primary jet nozzle and the pressure of the jet pump connected to the secondary jet nozzle are set to be made identical with each other, the secondary jet nozzle can jet the molten solder S more vigorously than the primary jet nozzle.

Although, in the present embodiments, the jet holes 32b and 42b have been arranged in a staggered manner, and when the first group of holes and the second group of holes are defined as one hole group, two hole groups have been arranged along the carrying direction of the substrate 5, the present invention is not limited to this. It is preferable that at least two hole groups be provided. Further, the hole group not only includes the first group of holes and the second group of holes, but also is composed of n rows (n is a natural number) of groups of holes along the direction orthogonal to the carrying direction of the substrate 5. If n is 2 or more, the groups of holes are preferably displaced from the first group of holes by 1/n pitch in the carrying direction of the substrate 5.

Although, in the present embodiments, the molten solder S has been jetted from the jet holes 32b and 42b in order to uniformly contact the molten solder S with the substrate 5, the present invention is not limited to this. The cross-sectional shape of the jet holes 32b and 42b parallel to the substrate 5 is not limited to a circle, but may be a polygon, a star, a cross, or the like.

Figure 12:
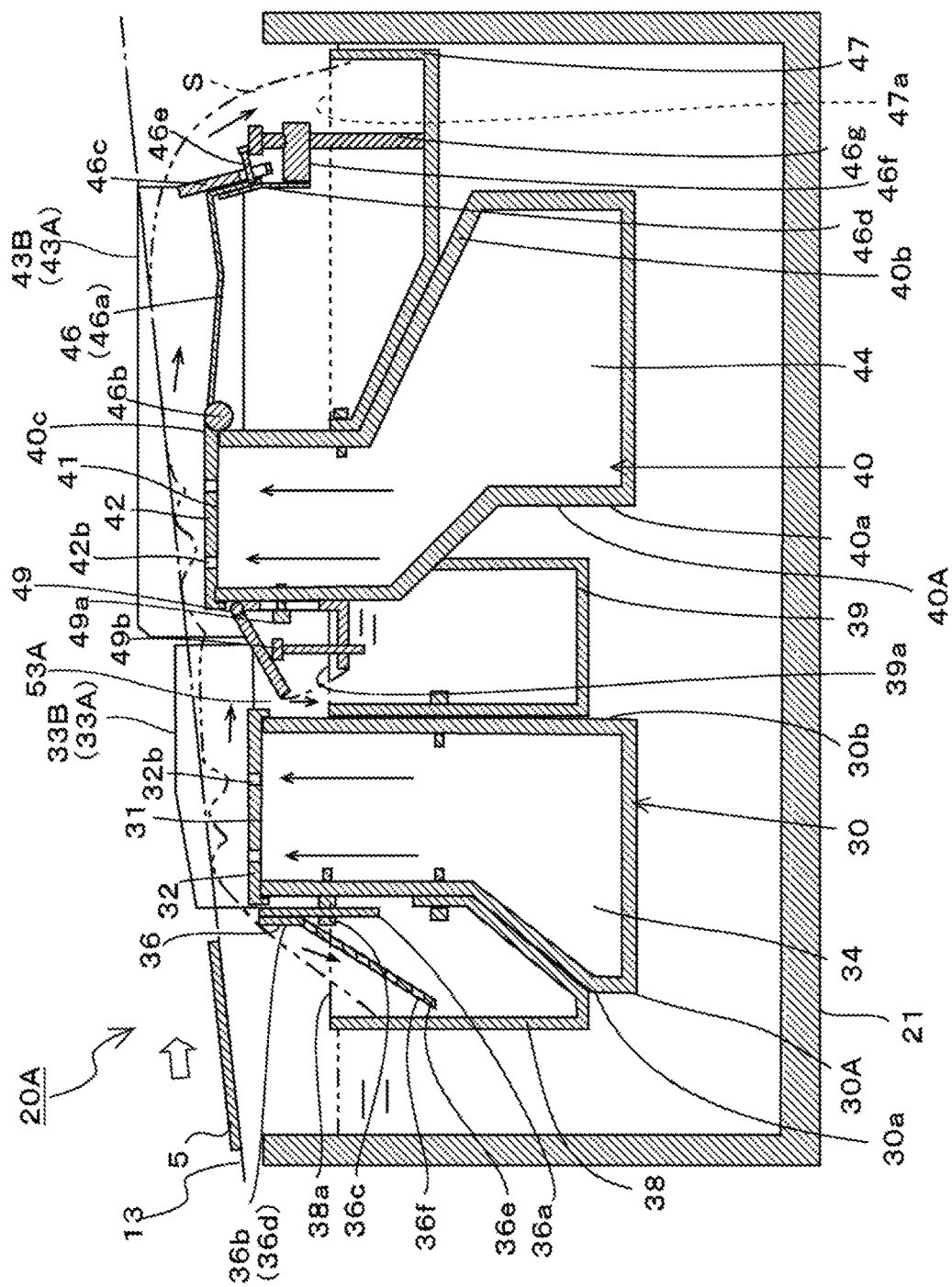
FIG. 12 is a schematic cross-sectional view showing a configuration example of the jet solder bath 20A according to a third embodiment of the present invention.

FIG. 12 is a schematic cross-sectional view showing a configuration example of the jet solder bath 20A according to the third embodiment of the present invention. A bridge member 49 having a variable configuration is provided instead of the bridge member 37 shown in FIG. 3, and the other configuration are the same. The bridge member 49 is configured to be movable up and down along the wall 40a at the upper end of the wall 40a of the secondary jet nozzle (second jet nozzle) 40, and is fixed at a mounting position by a screw 49a. Further, the bridge member 49 is configured to be rotatable, and is fixed at a rotation position by a screw 49b. By adjusting the vertical position and the rotational position of the bridge member 49, the substrate 5 contacts the molten solder S also while being carried above the bridge member 49 after the molten solder S that has been jetted from the primary jet nozzle 30 is attached thereto, so the temperature drop thereof is suppressed. The molten solder S that has been jetted from the primary jet nozzle 30 and attached to the substrate 5 is prevented from cooling and solidifying before coming into contact with the molten solder S from the secondary jet nozzle 40, so that uniform soldering can be attained. Note that the bridge member 49 may be provided on the wall 30b of the primary jet nozzle (first jet nozzle) 30.

Although, in the above-described embodiments, the substrate 5 has been provided with the through hole H and the molten solder S can be sufficiently wetted and rise in the through hole H, the present invention is not limited thereto. Good soldering can be performed even on a substrate in which the through hole H is not provided.

EXPLANATION OF CODES

1: Jet Soldering Device
5: Substrate
10: Body
13: Carrying Rails
15: Fluxer
16: Preheater Unit
17: Cooler
20 (20A, 20B): Jet Solder Bath
30, 50: Primary Jet Nozzle (First Jet Nozzle)
30A: Nozzle Body (First Nozzle Body)
30a, 30b: Wall
31: Jet Port
32: Solder-Flow-Forming Plate (First Solder-Flow-Forming Plate)
32b: Jet Hole
37, 37B, 49: Bridge Member
40, 60: Secondary Jet Nozzle (Second Jet Nozzle)
40a, 40b: Wall
40A: Nozzle Body (Second Nozzle Body)
41: Jet Port
42: Solder-Flow-Forming Plate (Second Solder-Flow-Forming Plate)
42b: Jet Holes
46, 76: Downstream-Forming Portion
53A, 53B, 53C: Gap
70: Tertiary Jet Nozzle (Third Jet Nozzle)
70A: Nozzle Body (Third Nozzle Body)
77: Guiding Member
S: Molten Solder

The invention claimed is:

1. A jet solder bath for performing soldering by jetting molten solder to bring the molten solder into contact with a substrate, the jet solder bath comprising:
   a first jet nozzle that jets the molten solder by a first jet pump; and
   a second jet nozzle that is arranged at a downstream side of the first jet nozzle along a substrate-carrying direction and jets the molten solder by a second jet pump, wherein the first jet nozzle includes:
   a first nozzle body; and
   a first solder-flow-forming plate that is provided at an upper end of the first nozzle body and has a plurality of jet holes, wherein the second jet nozzle includes:
   a second nozzle body; and
   a second solder-flow-forming plate that is provided at an upper end of the second nozzle body and has a plurality of jet holes,
   wherein a guide plate having a plurality of holes is provided on at least any of an upstream side of the first nozzle body in the substrate-carrying direction, a downstream side of the second nozzle body, and an interval between the first nozzle body and the second nozzle body, and wherein each of the plurality of the holes provided in the guide plate has a diameter larger than that of each of the plurality of jet holes provided in the first solder-flow-forming plate.

2. The jet solder bath according to claim 1,
wherein the plurality of jet holes of the first solder-flow-forming plate and the second solder-flow-forming plate, respectively, are arranged in a staggered manner, and
wherein, when a first group of holes forming a row along a direction orthogonal to the substrate-carrying direction and a second group of holes forming a row along the direction orthogonal to the substrate-carrying direction and being arranged at the downstream side of the first group of holes are defined as one hole group, at least two hole groups are arranged along the substrate-carrying direction.

3. The jet solder bath according to claim 1, wherein the guide plate is provided so as to be inclined with respect to a dropping direction of the molten solder which is jetted upward from below and dropped downward from above.

4. The jet solder bath according to claim 1, further comprising a bridge member arranged between the first jet nozzle and the second jet nozzle.

5. The jet solder bath according to claim 1, further comprising a third jet nozzle that is arranged at a downstream side of the second jet nozzle in the substrate-carrying direction and jets the molten solder by a third jet pump,
wherein the first jet nozzle and the second jet nozzle jet rough waves of the molten solder, and
wherein the third jet nozzle jets a gentle wave of the molten solder.

6. A jet soldering device comprising:
a preheater that preheats a substrate;
the jet solder bath according to claim 1;
a cooler that cools the substrate soldered in the jet solder bath; and
a control unit that controls operations of the preheater, the jet solder bath and the cooler.

7. A jet soldering device comprising:
a fluxer that applies flux to a substrate;
a preheater that preheats the substrate applied with the flux;
the jet solder bath according to claim 1;
a cooler that cools the substrate soldered in the jet solder bath; and
a control unit that controls operations of the fluxer, the preheater, the jet solder bath and the cooler.

8. The jet solder bath according to claim 4, further comprising a third jet nozzle that is arranged at a downstream side of the second jet nozzle in the substrate-carrying direction and jets the molten solder by a third jet pump,
wherein the first jet nozzle and the second jet nozzle jet rough waves of the molten solder, and
wherein the third jet nozzle jets a gentle wave of the molten solder.

9. A jet soldering device comprising:
a preheater that preheats a substrate;
the jet solder bath according to claim 4;
a cooler that cools the substrate soldered in the jet solder bath; and
a control unit that controls operations of the preheater, the jet solder bath and the cooler.

10. A jet soldering device comprising:
a preheater that preheats a substrate;
the jet solder bath according to claim 5;
a cooler that cools the substrate soldered in the jet solder bath; and
a control unit that controls operations of the preheater, the jet solder bath and the cooler.

11. A jet soldering device comprising:
a fluxer that applies flux to a substrate;
a preheater that preheats the substrate applied with the flux;
the jet solder bath according to claim 4;
a cooler that cools the substrate soldered in the jet solder bath; and
a control unit that controls operations of the fluxer, the preheater, the jet solder bath and the cooler.

12. A jet soldering device comprising:
a fluxer that applies flux to a substrate;
a preheater that preheats the substrate applied with the flux;
the jet solder bath according to claim 5;
a cooler that cools the substrate soldered in the jet solder bath; and
a control unit that controls operations of the fluxer, the preheater, the jet solder bath and the cooler.

* * * * *